(12) United States Patent  
Sasaki et al.

(10) Patent No.: US 7,960,646 B2  
(45) Date of Patent: Jun. 14, 2011

(54) SILICON-BASED THIN-FILM PHOTOELECTRIC CONVERTER AND METHOD OF MANUFACTURING THE SAME

(75) Inventors: Toshiaki Sasaki, Otsu (JP); Kenji Yamamoto, Kobe (JP)

(73) Assignee: Kaneka Corporation, Osaka-shi (JP)

( * ) Notice: Subject to any disclaimer, the term of this patent is extended or adjusted under 35 U.S.C. 154(b) by 245 days.

(21) Appl. No.: 11/991,141

(22) PCT Filed: Jul. 25, 2006

(86) PCT No.: PCT/JP2006/314605  
§ 371 (c)(1),  
(2), (4) Date: Feb. 28, 2008

(87) PCT Pub. No.: WO2007/026480  
PCT Pub. Date: Mar. 8, 2007

(65) Prior Publication Data  
US 2009/0133753 A1    May 28, 2009

(30) Foreign Application Priority Data  
Aug. 30, 2005  (JP) ................................. 2005-249551

(51) Int. Cl.  
*H01L 31/00* (2006.01)  
*B05D 5/12* (2006.01)

(52) U.S. Cl. ........ 136/261; 136/252; 136/255; 136/258; 438/56; 438/96; 438/97; 257/55; 257/431; 257/458; 257/464

(58) Field of Classification Search .................. 136/261, 136/252, 255; 438/56, 96, 97; 257/55, 431, 257/488, 464  
See application file for complete search history.

(56) References Cited

U.S. PATENT DOCUMENTS  
5,824,566 A * 10/1998 Sano et al. ...................... 438/69  
(Continued)

FOREIGN PATENT DOCUMENTS  
EP        1650812 A1    4/2006  
(Continued)

OTHER PUBLICATIONS

Banerjee et al., Reduction in thickness of N-type Microcrystalline Hydrogenated Silicon Film using Different Types of Seed Layer, Japan Journal of Applied Physics, 2002.*

(Continued)

*Primary Examiner* — Jennifer K. Michener  
*Assistant Examiner* — Matthew T Martin  
(74) *Attorney, Agent, or Firm* — Birch, Stewart, Kolasch & Birch, LLP

(57) ABSTRACT

In order to improve photoelectric conversion properties of a silicon-based thin-film photoelectric converter to which a conductive $SiO_x$ layer is inserted to obtain an optical confinement effect, the silicon-based thin-film photoelectric converter according to the present invention includes an i-type photoelectric conversion layer of hydrogenated amorphous silicon or an alloy thereof, an i-type buffer layer made of hydrogenated amorphous silicon, and an n-type $Si_{1-x}O_x$ layer (x is 0.25-0.6) stacked successively, wherein the buffer layer has a higher hydrogen concentration at its interface with and as compared with the photoelectric conversion layer and has a thickness of at least 5 nm and at most 50 nm. Accordingly, generation of silicon crystal phase parts and reduction of resistivity are promoted in the n-type $Si_{1-x}O_x$ layer, contact resistance at the interface is reduced, and FF of the photoelectric converter is improved, so that the photoelectric converter achieves improved properties.

7 Claims, 16 Drawing Sheets

U.S. PATENT DOCUMENTS 6,333,456 B1 * 12/2001 Yanagimachi ............... 136/255
2006/0043517 A1 3/2006 Sasaki et al.

FOREIGN PATENT DOCUMENTS

| JP | 2003-258279 A | 9/2003 |
|---|---|---|
| JP | 2005-045129 A | 2/2005 |
| WO | WO-2005/011001 A1 | 2/2005 |
| WO | WO-2005/011002 A1 | 3/2005 |

OTHER PUBLICATIONS

Rossi et al., "Optical and electrical properties of amorphous silicon-oxide with visible room temperature photoluminescencs", Applied Surface Science, 1996.*

Ichikawa et al.,"12% Two-Stacked a-Si:H Tandem Cells with a New P-Layer Structure", Photovoltaic Specialists Conference, Oct. 7-11, 1991, vol. 2, pp. 1296-1301.

Mohammad et al.,"Photovoltaic, I-V and C-V Characteristics of SnO2/SiO2/a-Si:H/mc-Si:H Structures". Japanese Journal of Applied Physics, vol. 29 (1990), Part 2, No. 11, Nov. 20, 1990, pp. L2080-L2081.

Chandan et al.,"Reduction of Thickness of N-Type Microcrystalline Hydrogenated Silicon Oxide Film Using Different Types of Seed Layer" Japanese Journal of Applied Physics, vol. 41 (2002), Part 2, No. 7A, Jul. 1, 2002, pp. L787-L789.

* cited by examiner

SILICON-BASED THIN-FILM PHOTOELECTRIC CONVERTER AND METHOD OF MANUFACTURING THE SAME

TECHNICAL FIELD

The present invention relates to a silicon-based thin-film photoelectric converter that includes a substantially i-type photoelectric conversion layer of hydrogenated amorphous silicon or a hydrogenated amorphous silicon alloy and a conductive $SiO_x$ layer, and to a method of manufacturing the same. Incidentally, the terms "crystalline" and "microcrystalline" in the present specification are used even in the case of referring to a substance including partial amorphous phase parts, as used in the relevant technical field.

BACKGROUND ART

In recent years, attention has been focused on photoelectric converters that utilize the photoelectric effect in semiconductor to convert light into electric power, and they have been under intensive development. Among the photoelectric converters, a silicon-based thin-film photoelectric converter can be formed on a large-area substrate of glass or stainless steel at a relatively lower temperature, and hence cost reduction thereof can be expected.

Such a silicon-based thin-film photoelectric converter generally includes a transparent electrode layer, at least one photoelectric conversion unit, and a back electrode layer that are stacked successively on a transparent insulating substrate. Here, the photoelectric conversion unit generally includes a p-type layer, an i-type layer, and an n-type layer stacked in this order or reverse order, where the i-type layer for photoelectric conversion occupies a main part of the unit. Thus, a unit including an amorphous i-type photoelectric conversion layer is referred to as an amorphous photoelectric conversion unit, while a unit including a crystalline i-type layer is referred to as a crystalline photoelectric conversion unit.

The photoelectric conversion layer serves as a layer that absorbs light and generates electron-hole pairs. Generally, in a silicon-based thin-film photoelectric converter, an i-type layer in a pin junction serves as the photoelectric conversion layer. An i-type layer, which is the photoelectric conversion layer, occupies a substantial film thickness of a photoelectric conversion unit.

Ideally, the i-type layer is an intrinsic semiconductor layer that contains no conductivity-type determining impurities. However, a layer containing a slight amount of impurities is referred to as a substantially i-type layer as long as it has a Fermi level approximately at the middle of its forbidden band, because such a layer can function as an i-type layer in a pin junction. The substantially i-type layer is generally deposited without adding conductivity-type determining impurities to a source gas. In this case, the substantially i-type layer may contain conductivity-type determining impurities in an allowable concentration range that does not affect the function of the i-type layer. Alternatively, the substantially i-type layer may be deposited with intentional addition of a slight amount of conductivity-type determining impurities in order to cancel influence of impurities originating from an atmosphere or an underlayer on the Fermi level.

When amorphous silicon or an amorphous silicon alloy is used for the photoelectric conversion layer, it is usual to deposit a layer of hydrogenated amorphous silicon or a hydrogenated amorphous silicon alloy that contains 5-20 atomic % hydrogen. As is well known, since amorphous silicon containing no hydrogen includes defects caused by unpaired bonds (dangling bonds) at a density as high as $10^{19}$-$10^{20}$ $cm^{-3}$, such amorphous silicon cannot be used for a semiconductor device such as a photoelectric converter. In contrast, since hydrogenated amorphous silicon in which dangling bonds are terminated by hydrogen atoms has a defect density lowered to $10^{15}$-$10^{17}$ $cm^{-3}$, it can be used for a semiconductor device such as a photoelectric converter. A hydrogenated amorphous silicon alloy containing an element such as carbon, oxygen, nitrogen, or germanium in addition to silicon can also has a defect density lowed by hydrogen atoms and thus it can also be used for a semiconductor device such as a photoelectric converter.

As a method of improving conversion efficiency of the photoelectric converter, there is known a photoelectric converter that adopts a stacked-type structure in which at least two photoelectric conversion units are stacked. In this method, a front side unit that includes a photoelectric conversion layer having a larger optical forbidden bandwidth is disposed on a light incident side of the photoelectric converter, and to rearward thereof, rear side units including their respective photoelectric conversion layers having smaller forbidden bandwidths are successively disposed in decreasing order of the bandwidth, so that incident light in a wider wavelength range can be converted photoelectrically. Accordingly, incident light can efficiently be used to improve conversion efficiency of the entire device. (In the present application, a photoelectric conversion unit disposed relatively nearer to a light incident side is referred to as a front side unit, and another unit disposed farther from the light incident side and adjacent to the front side unit is referred to as a rear side unit.)

Among the stacked-type thin-film photoelectric converters, the one including an amorphous photoelectric conversion unit and a crystalline photoelectric conversion unit stacked therein is referred to as a hybrid-type photoelectric converter. In the hybrid-type photoelectric converter, amorphous silicon can photoelectrically convert light in a wavelength range approximately up to 800 nm on a longer-wavelength side, while crystalline silicon can photoelectrically convert light in a wider wavelength range approximately up to 1100 nm, so that it become possible to effectively achieve photoelectric conversion of incident light in a wider wavelength range.

In either of the amorphous silicon single-unit photoelectric converter and the above-described hybrid-type photoelectric converter, it is preferred to make the photoelectric conversion layer as thin as possible from a viewpoint of improvement in productivity, i.e., cost reduction. Accordingly, there is generally used a structure that utilizes a so-called optical confinement effect, in which a layer having a refractive index lower than that of the photoelectric conversion layer is disposed to rearward of the conversion layer to effectively reflect light having a specific wavelength. Disposing the layer to rearward of the photoelectric conversion layer means that the layer may be placed in contact with the rear side of the photoelectric conversion layer, or may be placed on the rear side of another layer disposed on the rear side of the photoelectric conversion layer.

As a method of more effectively utilizing the optical confinement caused by the low refractive index layer described above, there is a method of forming an intermediate transmissible-reflective layer between the thin-film photoelectric conversion units in the stacked-type photoelectric converter, wherein the intermediate transmissible-reflective layer is made of a conductive material having a lower refractive index as compared to materials of the conversion units. The intermediate transmissible-reflective layer can be designed to reflect light in a shorter wavelength range and transmit light in a longer wavelength range, so that light can more effectively be converted photoelectrically in each of the thin-film photoelectric conversion units. For example, in the case that the intermediate transmissible-reflective layer is inserted between the front side amorphous silicon photoelectric conversion unit and the rear side crystalline silicon photoelectric conversion unit in the hybrid-type photoelectric converter, electric current generated by the front side unit can be increased without increase in thickness of the amorphous silicon photoelectric conversion layer in the front side unit. Furthermore, in the case of including the intermediate transmissible-reflective layer, the thickness of the amorphous silicon photoelectric conversion layer can be made smaller, as compared to the case of not including the intermediate transmissible-reflective layer, to obtain the same current value. Therefore, it becomes possible to avoid property deterioration of the amorphous silicon photoelectric conversion unit, where the deterioration is caused by optical degradation (Sraebler-Wronsky effect) that is more significant with increase in thickness of the amorphous silicon layer.

Patent Document 1 describes a stacked-type photoelectric converter in which an n-type $Si_{1-x}O_x$ layer is used as a low refractive index layer. The n-type $Si_{1-x}O_x$ layer is characterized in that it has an oxygen concentration of at least 25 atomic % and at most 60 atomic % and includes silicon-rich phase parts in an amorphous silicon-oxygen alloy phase, so as to achieve both of electric conductivity and a low refractive index. Note that the term "silicon-rich" literally means a high silicon concentration. Accordingly, inclusion of silicon-rich phase parts means a state including partial phase parts of higher silicon concentration. The n-type $Si_{1-x}O_x$ layer has a refractive index of 1.7-2.5 and a dark conductivity of $10^{-8}$-$10^{-1}$ S/cm. Furthermore, it is described that the silicon-rich phase parts preferably include silicon crystal phase parts because it is considered that the silicon crystal phase parts provide current paths therethrough in the thickness direction of the n-type $Si_{1-x}O_x$ layer and contribute to formation of favorable ohmic contact. Alternatively, it is also preferable that the silicon-rich phase parts include doped amorphous silicon parts, because either of n-type amorphous silicon and p-type amorphous silicon sufficiently doped with impurities makes it possible to obtain a film having a resistivity low enough to form ohmic contact, as is well known.

Furthermore, Patent Document 1 describes a structure in which a p-type amorphous silicon carbide layer/an i-type amorphous silicon photoelectric conversion layer/an n-type microcrystalline silicon layer/an n-type $Si_{1-x}O_x$ layer/a p-type microcrystalline silicon layer/an i-type crystalline silicon photoelectric conversion layer/an n-type microcrystalline silicon layer are successively stacked, and the n-type $Si_{1-x}O_x$ layer is used as an intermediate transmissible-reflective layer in the stacked-type photoelectric converter. In other words, Patent Document 1 describes that insertion of the n-type microcrystalline silicon layer between the i-type amorphous silicon photoelectric conversion layer and the n-type $Si_{1-x}O_x$ layer is effective for reducing contact resistance at the interface and improving the fill factor (FF) of the photoelectric converter.

Patent Document 1: Japanese Patent Laying-Open No. 2005-045129

DISCLOSURE OF THE INVENTION

Problems to be Solved by the Invention

The present inventors studied in detail the photoelectric converter as described above including a structure in which an i-type amorphous silicon photoelectric conversion layer/an n-type microcrystalline silicon layer/an n-type $Si_{1-x}O_x$ layer were stacked successively. As a result, it was found that this structure failed to sufficiently reduce resistivity of the n-type $Si_{1-x}O_x$ layer and also failed to sufficiently generate silicon crystal phase parts in the n-type $Si_{1-x}O_x$ layer, so that it was difficult to make the n-type $Si_{1-x}O_x$ layer have a refractive index less than 2 maintaining its low resistivity. Accordingly, it was found that there was room for further improvement in FF and/or Jsc of the photoelectric converter. It was also considered that impurities of phosphorus in n-type microcrystalline silicon absorbed light and reduced the photocurrent, and hence there was room for further improvement in Jsc of the photoelectric converter. It was further considered that need to form the n-type microcrystalline silicon layer and the n-type $Si_{1-x}O_x$ layer in an n-type film-deposition chamber for depositing n-type layers caused problems of prolonged tact time in the n-type film-deposition chamber and increase in the production costs.

In view of the above problems, therefore, the present invention intends to obtain improved photoelectric conversion properties in the silicon-based thin-film photoelectric converter in which the conductive $SiO_x$ layer is inserted to obtain the optical confinement effect.

Means for Solving the Problems

The present invention has been made in view of the above-described problems. A silicon-based thin-film photoelectric converter according to the present invention includes: a substantially i-type photoelectric conversion layer of hydrogenated amorphous silicon or a hydrogenated amorphous silicon alloy; a substantially i-type buffer layer mainly made of hydrogenated amorphous silicon; and an n-type $Si_{1-x}O_x$ layer (x is 0.25-0.6) stacked successively. The buffer layer has a higher hydrogen concentration at its interface with and as compared with the photoelectric conversion layer and has a thickness of at least 5 nm and at most 50 nm. The buffer layer has the higher hydrogen concentration at its interface with the photoelectric conversion layer and hence is in a state just before generation of silicon crystal phase parts, i.e., a state just before crystallization. When the n-type $Si_{1-x}O_x$ layer is deposited using the buffer layer as an underlayer, reduction of resistivity and generation of silicon crystal phase parts in the n-type $Si_{1-x}O_x$ layer are promoted thereby causing reduction of contact resistance at the interface and improvement of FF in the photoelectric converter, so that it is possible to provide the photoelectric converter having improved properties. Furthermore, by forming the buffer layer as an underlayer, it is possible to make the n-type $Si_{1-x}O_x$ layer have a lowered refractive index maintaining its low resistivity and then increase in both reflectance and transmittance thereat enhances the optical confinement effect and improves Jsc, so that it becomes possible to provide the photoelectric converter having improved properties. By depositing the buffer layer to a thickness of at least 5 nm, the thickness of the buffer layer becomes sufficient to produce a state just before crystallization. Therefore, it becomes possible to sufficiently reduce resistivity of the n-type $Si_{1-x}O_x$ layer formed on the buffer layer and then improve properties of the photoelectric converter. By depositing the buffer layer to a thickness of at most 50 nm, it is possible to avoid reduction of Jsc caused by light absorption loss in the buffer layer and then improve properties of the photoelectric converter.

Also in the case that the photoelectric conversion layer is made of a hydrogenated amorphous silicon alloy containing an element such as carbon, oxygen, nitrogen, or germanium in addition to silicon in the silicon-based thin-film photoelectric converter of the present invention, FF or Jsc is improved by making the buffer layer have a similarly higher hydrogen concentration at its interface with the photoelectric conversion layer.

It is preferable that the buffer layer has a hydrogen concentration of at least $1\times10^{22}$ atoms/cc measured by SIMS at its interface with the photoelectric conversion layer. By making the buffer layer have the higher hydrogen concentration, a state just before crystallization can be produced at the buffer layer's interface with the photoelectric conversion phase. Then, crystallization and reduction of resistivity are promoted in the n-type $Si_{1-x}O_x$ layer formed on the buffer layer serving as an underlayer, whereby making it possible to improve FF or Jsc of the photoelectric converter.

It is also preferable that the buffer layer has a lower hydrogen concentration at its interface with the n-type $Si_{1-x}O_x$ layer, as compared to the photoelectric conversion layer. With this condition, crystal phase parts are likely to be generated at the buffer layer's interface with the n-type $Si_{1-x}O_x$ layer, so that silicon crystal phase parts are easily generated and resistivity is easily reduced in the n-type $Si_{1-x}O_x$ layer formed on the buffer layer serving as an underlayer.

It is further preferable that the buffer layer includes crystal phase parts at its interface with the n-type $Si_{1-x}O_x$ layer. By using as an underlayer the buffer layer including crystal phase parts, it becomes possible to more easily promote reduction of resistivity and generation of silicon crystal phase parts in the n-type $Si_{1-x}O_x$ layer.

Here, it is preferable that the n-type $Si_{1-x}O_x$ layer includes silicon-rich phase parts in its amorphous silicon-oxygen alloy phase. By making the silicon-rich phase parts form current paths in the cross-sectional direction of the n-type $Si_{1-x}O_x$ layer, low resistivity can be realized even though the n-type $Si_{1-x}O_x$ layer has a high oxygen concentration and a low refractive index, thereby making it possible to provide the photoelectric converter having improved properties.

It is further preferable that the silicon-rich phase parts include silicon crystal phase parts. By making the silicon crystal phase parts form current paths in the cross-sectional direction, the resistivity can further be reduced thereby making it possible to provide the photoelectric converter having improved properties.

In a method of manufacturing the silicon-based thin-film photoelectric converter of the present invention, the buffer layer is formed by using a mixed gas containing at least hydrogen and silane as a source gas with a hydrogen/silane flow ratio within a range of 40-300. With the hydrogen/silane flow ratio within the range of 40-300, it is possible to increase hydrogen concentration at the buffer layer's interface with the photoelectric conversion layer, while the photoelectric conversion layer is not etched or damaged by hydrogen atoms generated during film deposition, whereby causing no increase of defects at the interface of the photoelectric conversion layer and then no decrease of FF. Accordingly, it is possible to produce the photoelectric converter having improved properties.

It is further preferable that at least a part of the photoelectric conversion layer and the buffer layer are formed in the same film-deposition chamber. In this case, it is possible to reduce tact time for forming the n-type layers in the film-deposition chamber and then reduce tact time for manufacturing the photoelectric converters and lower production costs thereof.

Effects of the Invention

The silicon-based thin-film photoelectric converter of the present invention includes: a substantially i-type photoelectric conversion layer of hydrogenated amorphous silicon or a hydrogenated amorphous silicon alloy; a substantially i-type buffer layer mainly made of hydrogenated amorphous silicon; and an n-type $Si_{1-x}O_x$ layer (x is 0.25-0.6) stacked successively. The buffer layer has a high hydrogen concentration at its interface with the photoelectric conversion layer, and hence is in a state just before generation of silicon crystal phase parts, i.e., a state just before crystallization. Accordingly, reduction of resistivity and generation of the silicon crystal phase parts are promoted in the n-type $S_{1-x}O_x$ layer, thereby causing reduction of contact resistance at the interface and improvement in FF in the photoelectric converter. Therefore, it is possible to provide the photoelectric converter having improved properties. Furthermore, by forming the buffer layer as an underlayer, it is possible to make the n-type $Si_{1-x}O_x$ layer have a lowered refractive index maintaining its low resistivity. Accordingly, the optical confinement effect caused by increase in reflectance and transmittance is enhanced and Jsc is improved, so that it is possible to provide the photoelectric converter having improved properties.

DESCRIPTION OF THE REFERENCE SIGNS

Figure 1:
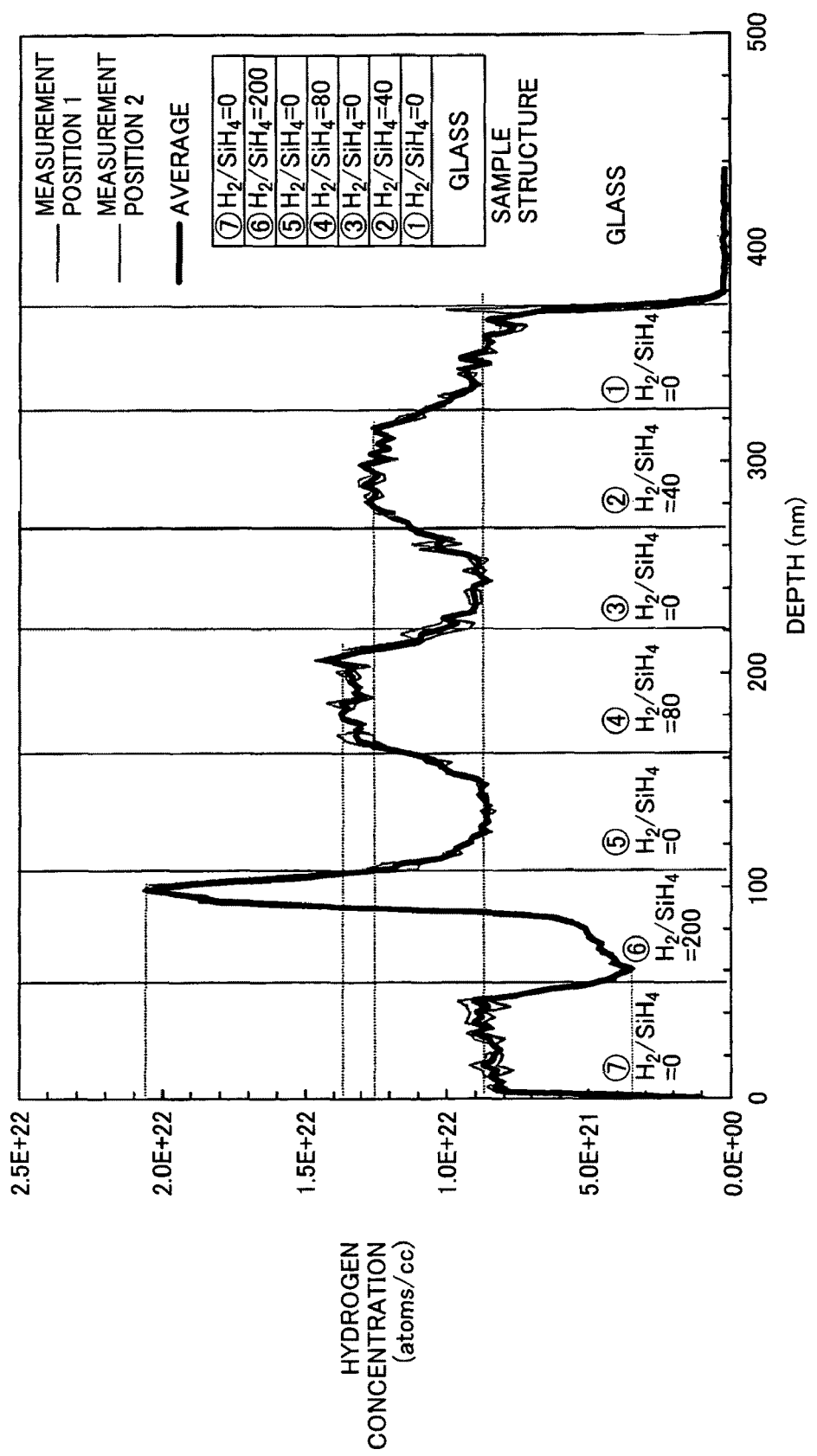
FIG. 1 shows a hydrogen concentration distribution in a depth-direction of a sample in which a plurality of buffer layers and a plurality of photoelectric conversion layers are stacked.

1: transparent substrate, 2: transparent electrode layer, 3: amorphous photoelectric conversion unit, 31: p-type amorphous silicon carbide layer, 32: substantially i-type photoelectric conversion layer of hydrogenated amorphous silicon, 33: buffer layer, 34: n-type $Si_{1-x}O_x$ layer, 35: n-type microcrystalline silicon layer, 36: n-type microcrystalline silicon layer, 37: n-type microcrystalline silicon layer, 4: back electrode layer, 5: front side photoelectric conversion unit, 51: p-type amorphous silicon carbide layer, 52: substantially i-type photoelectric conversion layer of hydrogenated amorphous silicon, 53: buffer layer, 54: n-type $Si_{1-x}O_x$ layer, 6: rear side photoelectric conversion unit, 61: p-type microcrystalline silicon layer, 62: photoelectric conversion layer of substantially i-type crystalline silicon, 63: n-type microcrystalline silicon layer, 7: first photoelectric conversion unit, 71: p-type amorphous silicon carbide layer, 72: substantially i-type photoelectric conversion layer of hydrogenated amorphous silicon, 73: buffer layer, 74: n-type $Si_{1-x}O_x$ layer, 8: second photoelectric conversion unit, 81: p-type amorphous silicon carbide layer, 82: substantially i-type photoelectric conversion layer of hydrogenated amorphous silicon-germanium, 83: buffer layer, 84: n-type $Si_{1-x}O_x$ layer, 9: third photoelectric conversion unit, 91: p-type microcrystalline silicon layer, 92: photoelectric conversion layer of substantially i-type crystalline silicon, 93: n-type microcrystalline silicon layer.

BEST MODES FOR CARRYING OUT THE INVENTION

Preferable embodiments of the present invention will hereinafter be described with reference to the drawings. Note that in the drawings of the present application, the dimensional relationship as to thickness, length or the like is modified as appropriate for the sake of clarity and simplification of the drawings and hence does not reflect the actual dimensional relationship. Furthermore, in the drawings, the same reference characters represent the same or corresponding portions.

In order to solve the above-described problems, the inventors keenly studied the silicon-based thin-film photoelectric converter that uses the n-type $Si_{1-x}O_x$ layer, and has found that these problems can be solved by a structure in which an i-type buffer layer is inserted between the i-type amorphous silicon photoelectric conversion layer and the n-type $Si_{1-x}O_x$ layer. Here, the buffer layer is characterized in that it is a substantially i-type layer mainly made of hydrogenated amorphous silicon, and has a higher hydrogen concentration at its interface with and as compared with the photoelectric conversion layer.

FIG. 1 shows a hydrogen concentration distribution in a depth-direction of a sample formed by alternately depositing i-type amorphous silicon photoelectric conversion layers and i-type buffer layers on a glass substrate. A drawing inserted in FIG. 1 shows a structure of the sample.

In this sample, the layers (indicated with $H_2/SiH_4=0$ in FIG. 1) were deposited under conditions for depositing the i-type amorphous silicon photoelectric conversion layer by using silane alone as a source gas in plasma CVD.

In this sample, the layers (indicated with $H_2/SiH_4=40$, 80 and 200 in FIG. 1) were deposited under conditions for depositing the i-type buffer layer by using silane diluted with hydrogen, as a source gas, at hydrogen/silane flow ratios of 40, 80, and 200, respectively.

In other words, this sample was formed by successively depositing (1) a photoelectric conversion layer/(2) a buffer layer made from silane diluted by hydrogen with a factor of 40/(3) a photoelectric conversion layer/(4) a buffer layer made from silane diluted by hydrogen with a factor of 80/(5) a photoelectric conversion layer/(6) a buffer layer made from silane diluted by hydrogen with a factor of 200/(7) a photoelectric conversion layer in this order on the glass substrate. Here, each of the layers (1)-(7) was set to be 50 nm thick.

Secondary ion mass spectroscopy (abbreviated as SIMS) was used to measure hydrogen concentration. The SIMS measurement was performed with use of $Cs^+$ ions at an acceleration voltage of 3 keV. The hydrogen concentration was measured at two positions in the sample. FIG. 1 shows measurement results at the two positions, and an averaged result of the two positions.

Hydrogen concentrations of the layers (1), (3), (5), and (7) (indicated with $H_2/SiH_4=0$ in FIG. 1) that were deposited under the conditions for depositing the i-type amorphous silicon photoelectric conversion layer, coincided with one another at the middle of thickness, with a deviation in a range of ±10%, and the average thereof was $8.5 \times 10^{21}$ atoms/cc.

Buffer layer (2) made from silane diluted by hydrogen with a factor of 40 showed a hydrogen concentration of $1.26 \times 10^{22}$ atoms/cc, which was higher than that of photoelectric conversion layer (1) serving as an underlayer. Similarly, buffer layer (4) made from silane diluted by hydrogen with a factor of 80 showed a hydrogen concentration of $1.37 \times 10^{22}$ atoms/cc, which was higher than that of photoelectric conversion layer (3) serving as an underlayer. Buffer layer (6) made from silane diluted by hydrogen with a factor of 200 showed a hydrogen concentration of $2.05 \times 10^{22}$ atoms/cc at its interface with photoelectric conversion layer (5) serving as an underlayer, which hydrogen concentration was higher than that of photoelectric conversion layer (5). Regarding the buffer layers made from silane diluted by hydrogen with factors of 40, 80 and 200 respectively, it can be commonly said that every buffer layer has a higher hydrogen concentration at its interface with and as compared with the photoelectric conversion layer serving as an underlayer, which hydrogen concentration was at least $1 \times 10^{22}$ atoms/cc.

Particularly, the buffer layer (6) made from silane diluted by hydrogen with a factor of 200 had a higher hydrogen concentration peak at its interface with and as compared with photoelectric conversion layer (5), and then its hydrogen concentration decreased with increase in thickness and finally became lower than that of the photoelectric conversion layer. The final decreased hydrogen concentration was $3.5 \times 10^{21}$ atoms/cc. This corresponds to the fact that when the buffer layer made from silane diluted by hydrogen with a factor of 200 is deposited to at least 20 nm thickness in an actual photoelectric converter, it has a lower hydrogen concentration at its interface with the n-type $Si_{1-x}O_x$ layer, as compared to the photoelectric conversion layer.

The buffer layer's interface with the photoelectric conversion layer corresponds to an initially deposited layer sticking on the photoelectric conversion layer. This portion has a hydrogen concentration higher than that of the photoelectric conversion layer and is in a state just before generation of silicon crystal phase parts, i.e., a state just before crystallization. When the layer thickness is gradually increased to a sufficient extent under conditions for depositing the buffer layer, crystallization starts and the hydrogen concentration becomes lower than that of the photoelectric conversion layer. The layer thickness at which crystallization starts becomes larger with smaller $H_2/SiH_4$, and becomes smaller with larger $H_2/SiH_4$. In the example of FIG. 1, when $H_2/SiH_4$ is 40 in (2) or 80 in (4), the hydrogen concentration at the layer thickness of 50 nm is higher than that of the photoelectric conversion layer, and the buffer layer is in a state just before crystallization. When $H_2/SiH_4$ is 200, the hydrogen concentration on the photoelectric conversion layer side of the buffer layer becomes higher as compared to the case where $H_2/SiH_4$ is 80. Subsequently, the hydrogen concentration is lowered with increase of the layer thickness and becomes lower than that of the photoelectric conversion layer. At that time, crystal silicon phase parts are generated in the buffer layer.

Figure 2:
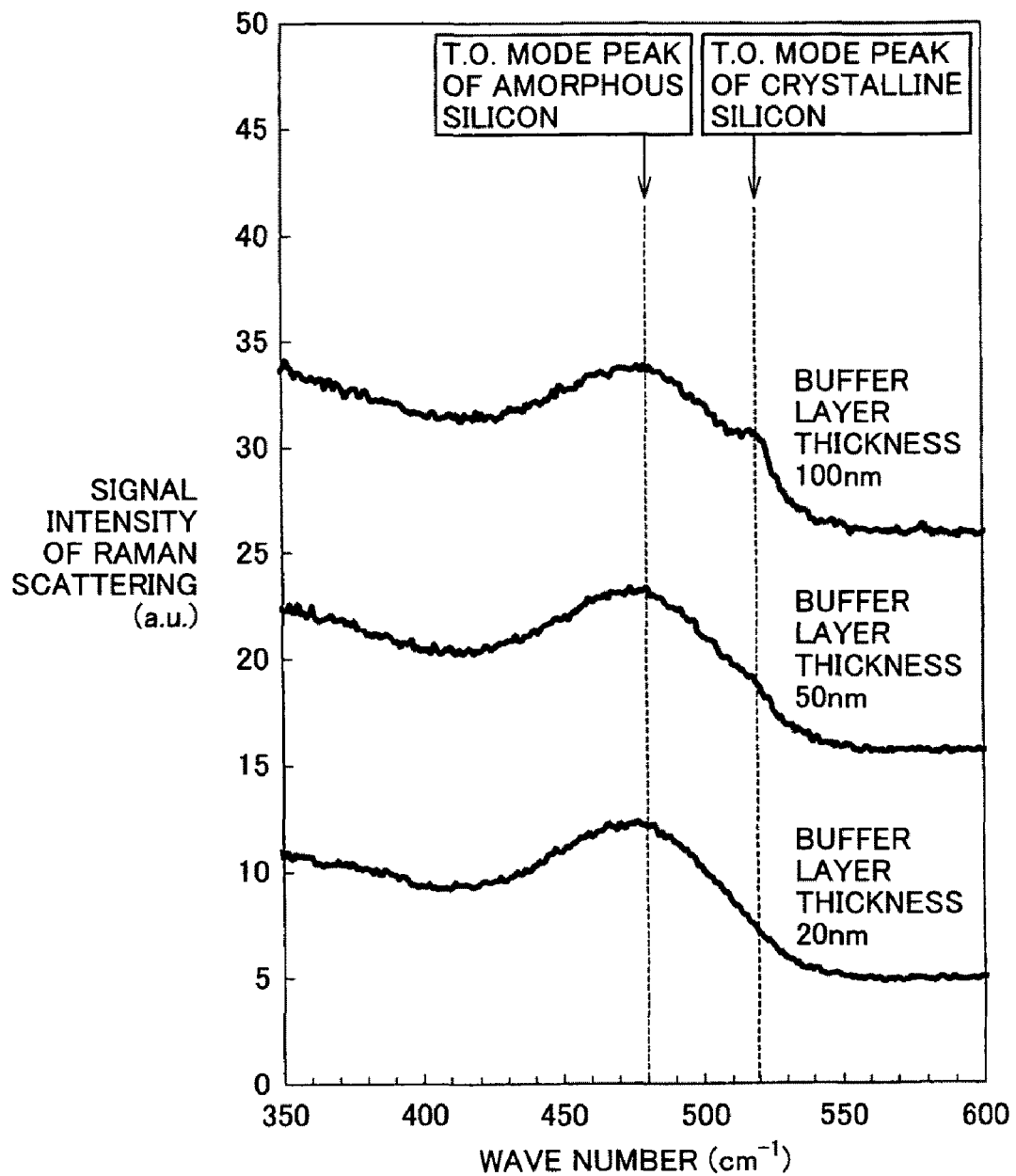
FIG. 2 shows Raman scattering spectra of samples in each of which a photoelectric conversion layer and a buffer layer are deposited successively.

FIG. 2 shows Raman scattering spectra of samples each formed by successively depositing a layer under conditions for depositing the i-type amorphous silicon photoelectric conversion layer and a layer under conditions for depositing the buffer layer on a glass substrate by plasma CVD. Here, every photoelectric conversion layer had a thickness of 300 nm. The buffer layers were deposited to their respective varied thicknesses under the condition of $H_2/SiH_4=200$.

Figure 16:
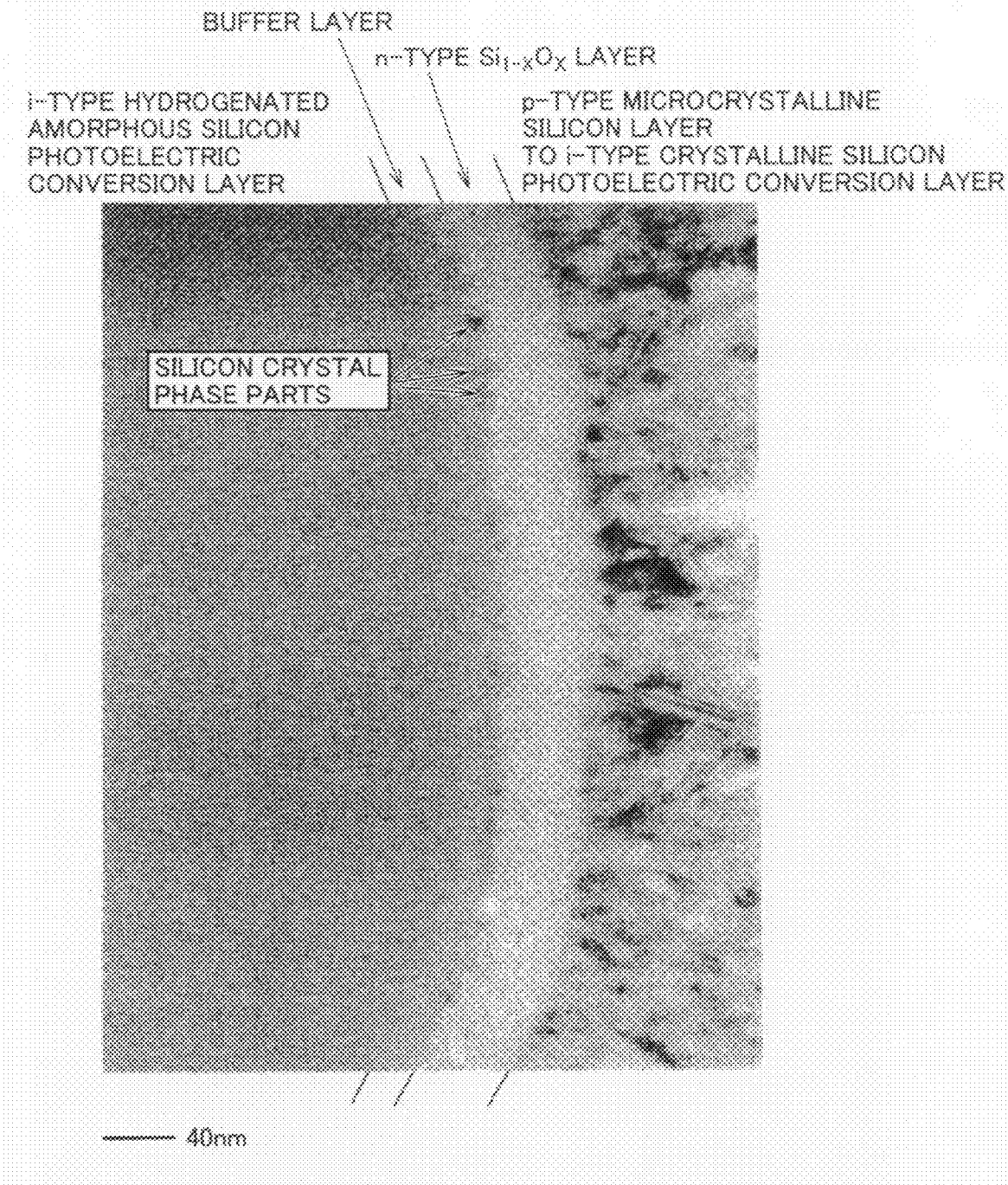
FIG. 16 is a bright-field image of a cross section of a stacked-type photoelectric converter in Example 6 of the present invention, obtained with transmission electron microscopy (TEM).
Figure 17:
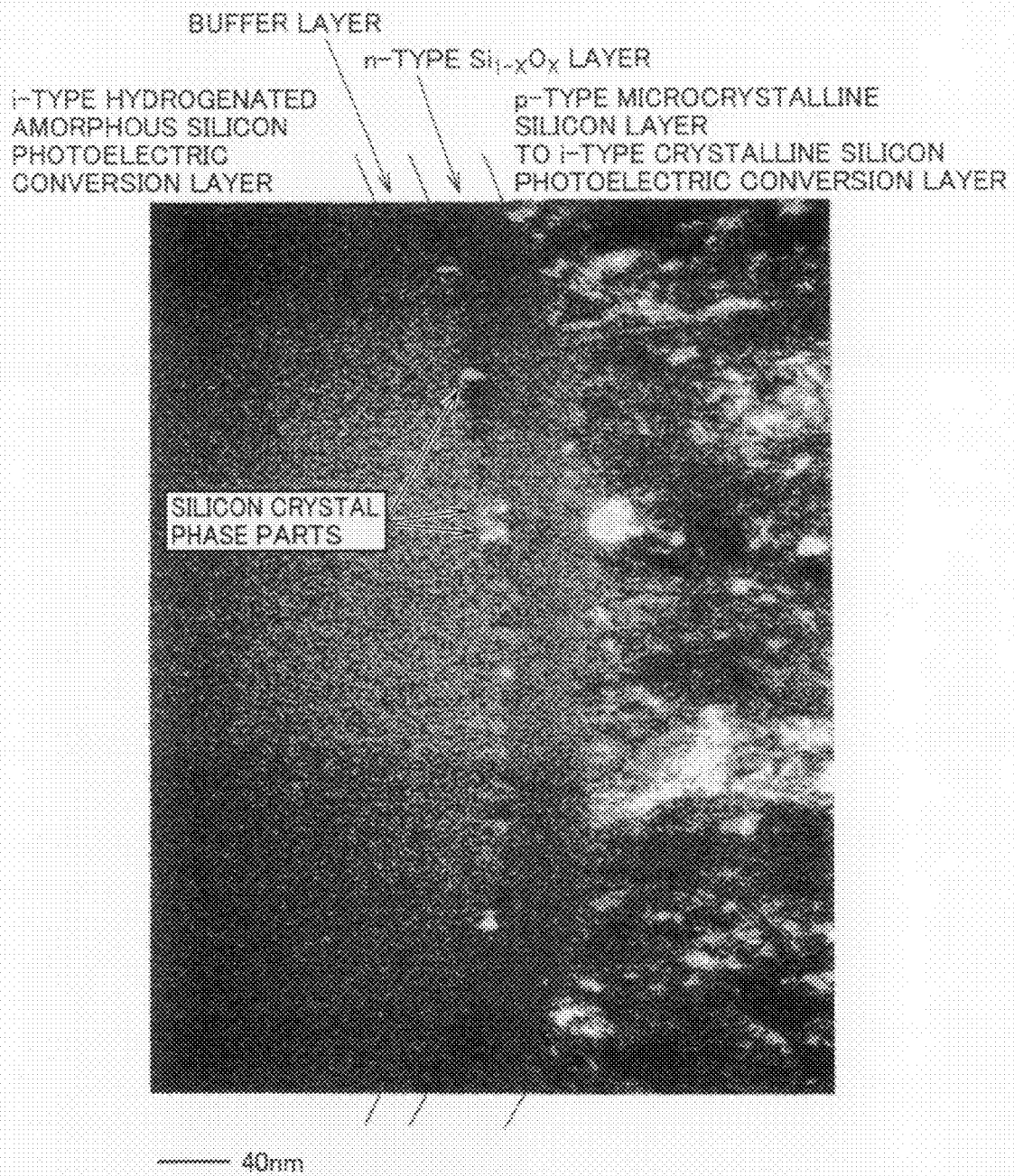
FIG. 17 is a dark-field image of a cross section of the stacked-type photoelectric converter in Example 6 of the present invention, obtained with transmission electron microscopy (TEM).

In FIG. 2, when the buffer layer has a thickness of 20 nm, there is only observed a peak of a transverse optical vibration mode (TO mode) of amorphous silicon at approximately 480 cm$^{-1}$. When the buffer layer has a thickness of 50 nm, there is slightly observed a inflection point at approximately 520 cm$^{-1}$ When the buffer layer has a thickness of 100 nm, there is observed a definite shoulder at approximately 520 cm$^{-1}$. This shoulder corresponds to a peak of a transverse optical vibration mode (TO mode) of crystalline silicon. Accordingly, it is recognized that when the thickness of the buffer layer is increased, silicon crystal phase parts are generated. It can also be said that when the buffer layer has a small thickness, it is in a state just before crystallization. However, this measurement method also senses a signal from hydrogenated amorphous silicon in the photoelectric conversion layer located under the buffer layer, and hence it should be noted that the signal peak at 480 cm$^{-1}$ appears in a somewhat intensified manner. As shown in FIGS. 16 and 17 explained below, there may be a case in that silicon crystal phase parts are actually generated even though the buffer layer has a thickness less than 50 nm.

Figure 3:
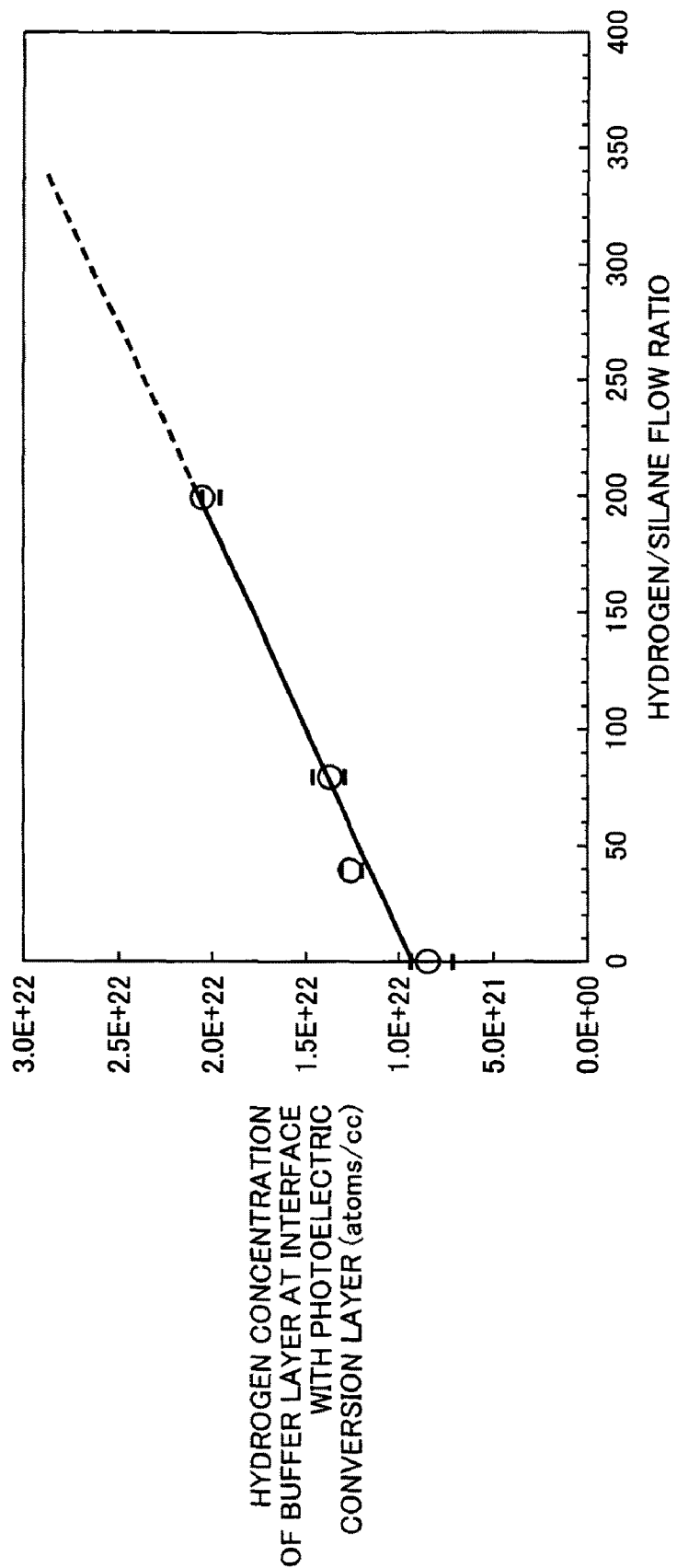
FIG. 3 is a correlation diagram of hydrogen concentration of the buffer layer at its interface with the photoelectric conversion layer, with respect to hydrogen/silane flow ratio.

FIG. 3 shows hydrogen concentration of the buffer layer at its interface with the photoelectric conversion layer, with respect to hydrogen/silane flow ratio. The hydrogen concentration increases almost linearly with respect to the hydrogen/silane flow ratio. The hydrogen concentration becomes at least $1\times10^{22}$ atoms/cc at a hydrogen/silane flow ratio of at least approximately 20.

Figure 4:
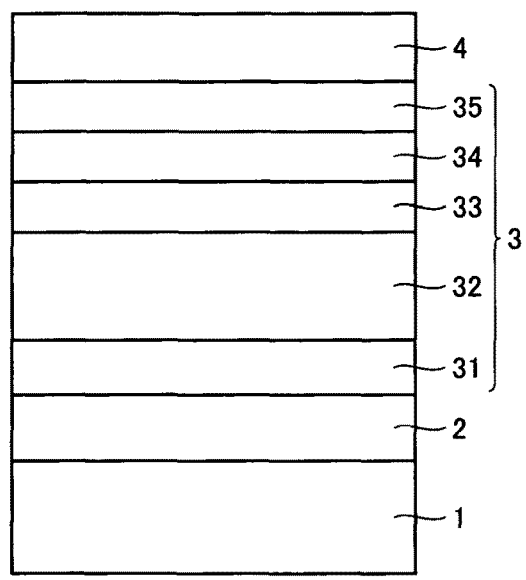
FIG. 4 is a structural cross-sectional view of a single junction photoelectric converter according to an embodiment of the present invention.

FIG. 4 shows a cross-sectional view of a single-junction silicon-based thin-film photoelectric converter according to an embodiment of the present invention. On a transparent substrate 1, a transparent electrode layer 2, an amorphous photoelectric conversion unit 3, and a back electrode layer 4 are disposed in this order.

For transparent substrate 1 in a type of photoelectric converter on which light is made incident from the substrate side, there is used a plate-like member or a sheet-like member that is made of glass, transparent resin, or the like.

It is preferable that transparent electrode layer 2 is made of a conductive metal oxide such as $SnO_2$ or ZnO and is deposited by a method such as CVD, sputtering, or evaporation. It is also preferable that transparent electrode layer 2 has fine surface unevenness to thereby enhance effect of scattering incident light.

It is preferable that amorphous photoelectric conversion unit 3 has a pin junction and includes a p-type layer 31, a substantially i-type photoelectric conversion layer 32 of hydrogenated amorphous silicon, a substantially i-type buffer layer 33 mainly made of hydrogenated amorphous silicon, an n-type $Si_{1-x}O_x$ layer 34 (x is 0.25-0.6), and an n-type layer 35. As the material of photoelectric conversion layer 32, it is also possible to use an alloy material containing an element such as carbon, oxygen, nitrogen, or germanium in addition to silicon, instead of hydrogenated amorphous silicon that contains silicon alone as a main element of semiconductor. Furthermore, the main constituent material for each of the conductivity-type layers is not necessarily the same as that of the i-type layer. For example, amorphous silicon carbide may be used for the p-type layer, and a silicon layer containing micro silicon crystals (also referred to as μc-Si) may also be used for the n-type layer.

A high-frequency plasma CVD method is suitable for forming the amorphous photoelectric conversion unit. The conditions preferably used for forming the photoelectric conversion unit are as follows: a substrate temperature of 100-300° C., a pressure of 30-1500 Pa, a power supply frequency of 10-100 MHz, and a high-frequency power density of 0.01-0.5 W/cm$^2$. As the source gas used for forming the photoelectric conversion unit, there is used a silicon-containing gas such as silane or disilane, or a mixture of these gases and hydrogen. As the dopant gas for forming the p-type or n-type layer in the photoelectric conversion unit, $B_2H_6$, $PH_3$, or the like is used preferably.

Buffer layer 33, which is one of the important components of the present invention, is characterized in that it is mainly made of hydrogenated amorphous silicon, in that it has a higher hydrogen concentration at its interface with and as compared with the photoelectric conversion layer, and in that its thickness is at least 5 nm and at most 50 nm. The buffer layer's interface with the photoelectric conversion layer corresponds to an initially deposited layer sticking on the photoelectric conversion layer. This portion has a hydrogen concentration higher than that of the photoelectric conversion layer and is in a state just before generation of silicon crystal phase parts, i.e., a state just before crystallization. When this buffer layer is used as an underlayer to form the n-type $Si_{1-x}O_x$ layer, reduction of resistivity and generation of silicon crystal phase parts in the n-type $Si_{1-x}O_x$ layer are promoted thereby causing reduction of contact resistance at the interface and improvement of FF in the photoelectric converter, so that it is possible to provide the photoelectric converter having improved properties. Furthermore, when the buffer layer is formed as an underlayer, it is possible to make the n-type $Si_{1-x}O_x$ layer have a lowered refractive index maintaining its low resistivity, and then increase in both reflectance and transmittance thereat enhances the optical confinement effect and improves Jsc, so that it is possible to provide the photoelectric converter having improved properties. By forming the buffer layer to have a thickness of at least 5 nm, the thickness of the buffer layer becomes sufficient to produce a state just before crystallization. Therefore, it becomes possible to sufficiently reduce resistivity of the n-type $Si_{1-x}O_x$ layer formed on the buffer layer and then improve properties of the photoelectric converter. By forming the buffer layer to have a thickness of at most 50 nm, it is possible to avoid reduction of Jsc caused by light absorption loss in the buffer layer and then improve properties of the photoelectric converter.

Buffer layer 33 is deposited preferably with use of $SiH_4$ and $H_2$ as a reaction gas, at a $H_2/SiH_4$ ratio within a range of 40-300. At this time, the conditions for plasma CVD are as follows: for example, a capacitive-coupling parallel-plate electrode is used with conditions of a power supply frequency of 10-100 MHz, a high-frequency power density of 0.01-0.5 W/cm², a pressure of 50-1500 Pa, and a substrate temperature of 150-250° C. The $H_2/SiH_4$ is preferably at least 40. At that time, as shown in FIG. 3, the buffer layer achieves a hydrogen concentration of at least $1\times10^{22}$ atoms/cc at its interface with the photoelectric conversion layer and is brought into a state just before crystallization. Furthermore, the $H_2/SiH_4$ is preferably at most 300, in order to avoid increase of defects at the interface of the photoelectric conversion layer and then decrease of FF, which are caused in the photoelectric conversion layer being etched or damaged by hydrogen atoms generated during film deposition.

The buffer layer is preferably deposited in an i-type film-deposition chamber for forming the photoelectric conversion layer. The buffer layer is a substantially i-type layer and hence can be deposited in the same chamber as that for the photoelectric conversion layer. Accordingly, tact time in the n-type film-deposition chamber is no longer a rate-limiting factor, so that it is possible to shorten tact time for manufacturing the photoelectric converters and lower production costs thereof. If the buffer layer is deposited in an n-type film-deposition chamber, defect density therein is increased under influence of impurities such as phosphorus sticking on the camber wall, leading to decrease in FF. In this regard as well, the buffer layer is preferably deposited in the i-type film-deposition chamber.

The n-type $Si_{1-x}O_x$ layer preferably has an oxygen concentration of at least 25 atomic % and at most 60 atomic % to achieve both of conductivity and a low refractive index. At that time, it is preferable that silicon-rich phase parts are included in an amorphous silicon-oxygen alloy phase, and it is more preferable that the silicon-rich phase parts are silicon crystal phase parts. The n-type $Si_{1-x}O_x$ layer preferably has a refractive index of at least 1.7 and at most 2.5 for light of 600 nm wavelength, and more preferably at least 1.8 and at most 2.1, to obtain sufficient reflection effect. The n-type $Si_{1-x}O_x$ layer preferably has such conductivity that the layer itself exerts no influence on series resistance of the solar battery. Specifically, the conductivity thereof is preferably at least $10^{-8}$ S/cm. The intensity ratio of a TO (transverse optical vibration) mode peak of the crystalline silicon constituent to a TO mode peak of the amorphous silicon constituent, measured by Raman scattering, is preferably at least 0.5 and at most 10 to realize optimal dark conductivity. Furthermore, the dopant atom concentration in the n-type $Si_{1-x}O_x$ layer is preferably in a range of $3\times10^{20}$-$1.8\times10^{21}$ cm⁻³.

The n-type $Si_{1-x}O_x$ layer can be formed with a plasma CVD method, using $SiH_4$, $CO_2$, $H_2$ and $PH_3$ as a reaction gas, with a high $H_2/SiH_4$ ratio, i.e., under the condition for forming a microcrystalline layer, and with a $CO_2/SiH_4$ ratio of at least 2. At that time, the conditions for plasma CVD using a capacitive-coupling parallel-plate electrode are as follows: a power supply frequency of 10-100 MHz, a high-frequency power density of 0.01-0.5 W/cm², a pressure of 50-1500 Pa, and a substrate temperature of 150-250° C. If the $CO_2/SiH_4$ ratio is increased, the oxygen concentration in the film is monotonously increased.

For back electrode layer 4, at least one metal layer made of at least one material selected from Al, Ag, Au, Cu, Pt, and Cr is preferably deposited by a sputtering method or a evaporation method. Furthermore, a layer of a conductive oxide such as ITO, $SnO_2$, or ZnO (not shown) may be formed between the photoelectric conversion unit and the metal layer.

Figure 5:
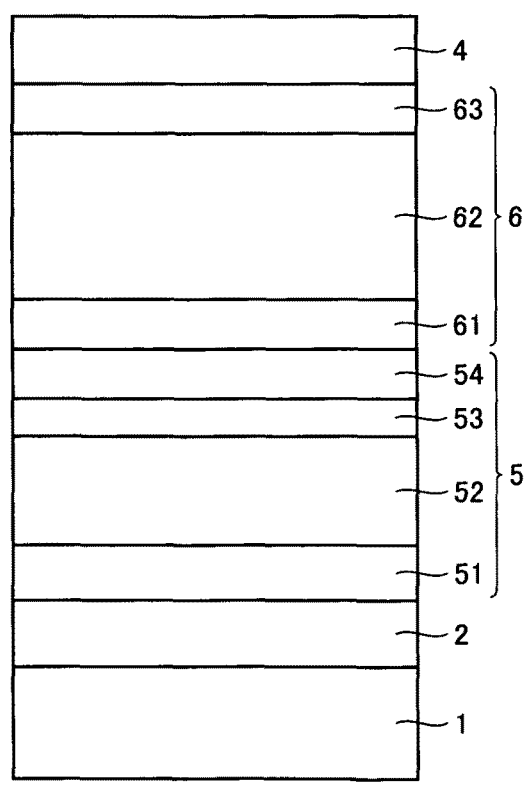
FIG. 5 is a structural cross-sectional view of a stacked-type photoelectric converter according to another embodiment of the present invention.

FIG. 5 is a cross-sectional view of a stacked-type silicon-based thin-film photoelectric converter according to another embodiment of the present invention. A transparent electrode layer 2, a front side photoelectric conversion unit 5, a rear side photoelectric conversion unit 6, and a back electrode layer 4 are disposed in this order on a transparent substrate 1.

Each of transparent substrate 1, transparent electrode layer 2, and back electrode layer 4 has the same structure as that in FIG. 4. Front side photoelectric conversion unit 5 preferably includes a pin junction formed with a p-type layer 51, a substantially i-type photoelectric conversion layer 52 of hydrogenated amorphous silicon, a substantially i-type buffer layer 53 mainly made of hydrogenated amorphous silicon, and an n-type $Si_{1-x}O_x$ layer 54 (x is 0.25-0.6). In this case, the n-type $Si_{1-x}O_x$ layer serves as an intermediate transmissible-reflective layer as well as an n-type layer. Each layer in front side photoelectric conversion unit 5 is deposited by the same method as in the embodiment of FIG. 4.

Rear side photoelectric conversion unit 6 is formed, for example, by stacking semiconductor layers in the pin-type order by a plasma CVD method. Specifically, one conductivity-type layer 61, a photoelectric conversion layer 62, and an opposite conductivity-type layer 63 may be stacked in this order. One conductivity-type layer 61 may be a p-type microcrystalline silicon layer doped with boron atoms that serve as conductivity-type determining impurities with at least 0.01 atomic %. Photoelectric conversion layer 62 may be a substantially i-type crystalline silicon layer. Opposite conductivity-type layer 63 may be an n-type microcrystalline silicon layer doped with phosphorus atoms that serve as conductivity-type determining impurities with at least 0.01 atomic %. Although two photoelectric conversion units are stacked in FIG. 5, three or more photoelectric conversion units may of course be stacked as described later.

EXAMPLES

The detailed descriptions will hereinafter be provided based on examples according to the present invention, and comparative examples according to the conventional technique. In the drawings, similar members are provided with the same reference numbers, and similar descriptions thereof will not be repeated. Furthermore, the present invention is not limited to the following examples as long as it does not go beyond the gist thereof.

Figure 6:
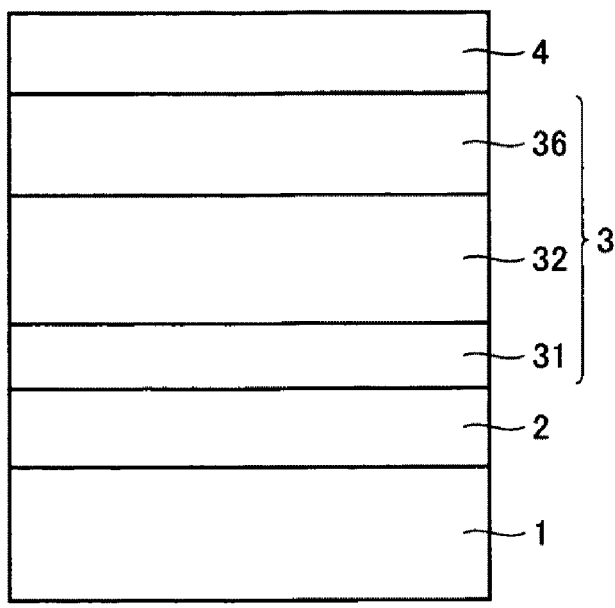
FIG. 6 is a structural cross-sectional view of a single-junction photoelectric converter in Comparative Example 1 according to the conventional technique.

In Examples 1 and 2 and Comparative Examples 1 and 2, single-junction amorphous photoelectric converters were formed, and experiments were conducted on them with their structure modified. At that time, there was adopted a structure formed by successively stacking a transparent substrate/a transparent electrode layer/a p-type amorphous silicon carbide layer/a photoelectric conversion layer of substantially i-type hydrogenated amorphous silicon/a "structure-modified portion"/a back electrode layer, while the structure and formation method thereof were kept to be similar except for the "structure-modified portion". Table 1 collectively shows output properties of photoelectric converters in Examples 1 and 2, and Comparative Examples 1 and 2. The output properties were measured at a room temperature with irradiation of AM 1.5 light at an intensity of 100 mW/cm². As to abbreviations in a column of "Structure-Modified Portion" in Table 1, the n-type microcrystalline silicon layer is referred to as (μc-Si(n)), the n-type $Si_{1-x}O_x$ layer as (SiO(n)), and the buffer layer as (i-buf).

layer 34/n-type microcrystalline silicon layer 35 successively stacked with use of chamber P5 serving as an n-type film-deposition chamber, instead of n-type microcrystalline silicon layer 36 in FIG. 6. N-type microcrystalline silicon layer 37 had a thickness of 20 nm, n-type $Si_{1-x}O_x$ layer had a thickness of 60 nm, and n-type microcrystalline silicon layer 35 had a thickness of 5 nm. The deposition conditions for

TABLE 1

| | "Structure-Modified Portion" | Voc (V) | Jsc (mA/cm2) | FF | Eff (%) | Note |
|---|---|---|---|---|---|---|
| Comparative Example 1 | μc-Si(n) | 0.876 | 14.18 | 0.684 | 8.49 | |
| Comparative Example 2 | μc-Si(n)/SiO(n)/μc-Si(n) | 0.884 | 14.26 | 0.693 | 8.73 | |
| Example 1 | i-buf/SiO(n)/μc-Si(n) | 0.884 | 14.34 | 0.700 | 8.87 | i-buf was deposited in n-film-deposition chamber |
| Example 2 | i-buf/SiO(n)/μc-Si(n) | 0.883 | 14.37 | 0.711 | 9.02 | i-buf was deposited in i-film-deposition chamber |

Comparative Example 1

FIG. 6 is a cross-sectional view of an amorphous photoelectric converter in Comparative Example 1. A glass substrate was used as a transparent substrate 1. On transparent substrate 1, an $SnO_2$ film including fine pyramidal surface unevenness and having an average thickness of 700 nm was formed as a transparent electrode layer 2 by a thermal CVD method. The obtained transparent electrode layer 2 had a sheet resistivity of approximately 9Ω/□, a haze ratio of 12% measured with a C light source, and an average level difference d of approximately 100 nm in the surface unevenness.

On transparent electrode layer 2, an amorphous photoelectric conversion unit 3 was formed by using a plasma CVD apparatus having five film-deposition chambers. The film-deposition chambers were composed of a p-type film-deposition chamber (a chamber P1), three i-type film-deposition chambers (a chamber P2, a chamber P3, and a chamber P4), and an n-type film-deposition chamber (a chamber P5). A p-type amorphous silicon carbide layer 31 of 15 nm thickness was formed in chamber P1, a photoelectric conversion layer 32 of substantially i-type hydrogenated amorphous silicon having a thickness of 300 nm was formed in chambers P2-P4, and an n-type microcrystalline silicon layer 36 of 30 nm thickness was formed in chamber P5, to thereby form amorphous photoelectric conversion unit 3. At that time, manufacturing tact time in the CVD apparatus was 12 minutes, while tact time in chamber P5 was 6 minutes 30 seconds, and hence the tact time in chamber P5 was not a rate-limiting factor in the manufacturing tact time. Subsequently, a 30 nm thick ZnO film doped with Al and a 300 nm thick Ag film were successively formed as back electrode layer 4 by a sputtering method.

As shown in Table 1, measurement of output properties of the photoelectric converter in Comparative Example 1 showed an open-circuit voltage (Voc) of 0.876 V, a short-circuit current density (Jsc) of 14.18 mA/cm², a fill factor (FF) of 0.684, and conversion efficiency (Eff) of 8.49%.

Comparative Example 2

Figure 7:
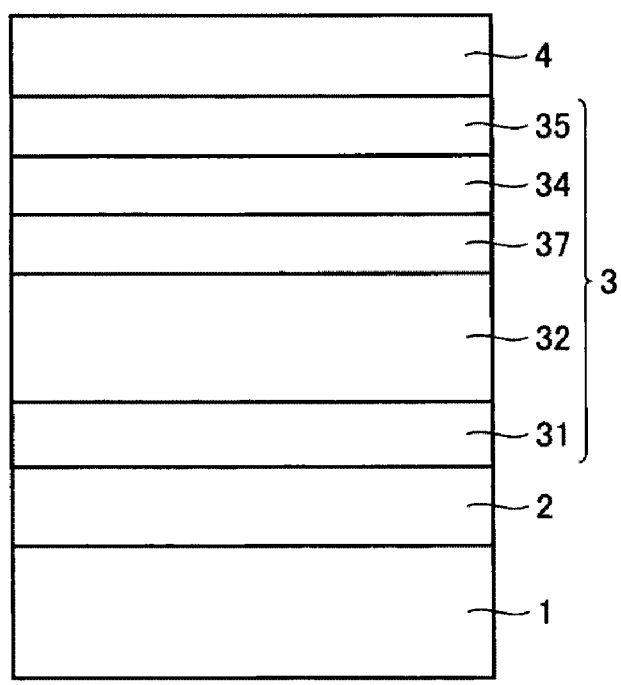
FIG. 7 is a structural cross-sectional view of a single-junction photoelectric converter in Comparative Example 2 according to the conventional technique.

An amorphous photoelectric converter as shown in FIG. 7 was formed as Comparative Example 2. The device of Comparative Example 2 as shown in FIG. 7 differs from that of Comparative Example 1 in that it adopted a structure including an n-type microcrystalline silicon layer 37/n-type $Si_{1-x}O_x$ n-type $Si_{1-x}O_x$ layer were as follows: a gas flow rate $SiH_4/CO_2/PH_3/H_2$=80/180/2/20000 sccm, a power supply frequency of 13.56 MHz, a power density of 100 mW/cm², a pressure of 350 Pa, and a substrate temperature of 200° C.

Various properties of an n-type $Si_{1-x}O_x$ layer, which was deposited to a thickness of 200 nm on a glass plate under the same deposition conditions, were as follows. The refractive index was 2.0 for light of 600 nm wavelength, when measured by spectral ellipsometry. The electrical conductivity was $1×10^{-4}$ S/cm. The intensity ratio of a TO mode peak of a crystalline silicon constituent to a TO mode peak of an amorphous silicon constituent was 2.0, when measured by Raman scattering. Furthermore, the oxygen concentration was 42 atomic %, when measured by X-ray photoelectron spectroscopy. In this case, tact time in chamber P5 was 17 minutes, and then it became a rate-limiting factor prolonging the manufacturing tact time in the CVD apparatus to 17 minutes.

As shown in Table 1, output properties of the photoelectric converter in Comparative Example 2 were as follows: Voc=0.884 V, Jsc=14.26 mA/cm², FF=0.693, and Eff=8.73%.

As compared to Comparative Example 1, each of the Voc, Jsc, and FF was increased and Eff was improved. It can be said that increase of Jsc is attributable to increase of photocurrent, caused by an optical confinement effect due to the n-type $Si_{1-x}O_x$ layer. The reason for increase of Voc and FF is uncertain. However, this seems to be because the total thickness of n-type microcrystalline silicon layer 37, n-type $Si_{1-x}O_x$ layer 34, and n-type microcrystalline silicon layer 35, i.e., the three n-type layers, became large thereby intensifying the internal electric field of the photoelectric conversion unit.

Example 1

A single-junction amorphous photoelectric converter as shown in FIG. 4 was formed as Example 1. The device of Example 1 as shown in FIG. 4 differs from that of Comparative Example 2 in that substantially i-type buffer layer 33 mainly made of hydrogenated amorphous silicon was used instead of n-type microcrystalline silicon layer 37 in FIG. 7. Buffer layer 33 had a thickness of 5 nm. The deposition conditions for buffer layer 33 were as follows: chamber P5 serving as an n-type film-deposition chamber was used under conditions of an $H_2/SiH_4$ flow ratio=80, a gas flow rate of $H_2/SiH_4$=12800/160 sccm, a power supply frequency of 13.56 MHz, a power density of 100 mW/cm², a pressure of 600 Pa, and a substrate temperature of 200° C. Hydrogen concentration at the buffer layer's interface with the photoelectric conversion layer was $1.37 \times 10^{22}$ atoms/cc, when measured by SIMS. Hydrogen concentration of the photoelectric conversion layer was $8.5 \times 10^{21}$ atoms/cc. In this case, tact time in chamber P5 was 15 minutes, and then it became a rate-limiting factor prolonging manufacturing tact time in the CVD apparatus to 15 minutes.

As shown in Table 1, output properties of the photoelectric converter in Example 1 were as follows: Voc=0.884 V, Jsc=14.34 mA/cm$^2$, FF=0.700, and Eff=8.87%. The photoelectric converter of Example 1 achieves increase in Jsc and FF, and improvement in Eff, as compared with Comparative Example 2.

Increase of Jsc seems to be attributable to the fact that n-type microcrystalline silicon layer 37 was replaced with buffer layer 34 whereby decreasing light absorption due to phosphorus impurities and then increasing photocurrent. The reason for improvement of FF in Example 1 as compared to Comparative Example 2 is uncertain. However, the reason seems to be as follows: in Comparative Example 2, n-type microcrystalline silicon layer 37 had tendency to easily crystallize due to influence of phosphine therein, so that the interface between amorphous photoelectric conversion layer 32 and n-type microcrystalline layer 37 became discontinuous thereby increasing carrier recombination loss at the interface. In contrast, it is considered in Example 1 that buffer layer 33 of an i-type had a high hydrogen concentration at its interface with the photoelectric conversion layer and was in a state just before crystallization, and then tendency of crystallization was increased from buffer layer 33 to n-type $Si_{1-x}O_x$ layer 34, causing better continuity at the interface and improvement of FF. It is also considered that n-type microcrystalline silicon layer 37 was replaced with i-type buffer layer 33, and hence defects due to phosphorus impurities are decreased, causing decrease of carrier recombination loss and improvement of FF. From the improvement of FF, it is further considered that when buffer layer 33 was used as an underlayer, reduction of resistivity and generation of silicon crystal phase parts in the n-type $Si_{1-x}O_x$ layer formed thereon were sufficiently promoted to reduce contact resistance at the interface.

Example 2

A photoelectric converter having a structure similar to that of Example 1 was formed in Example 2, which was different from Example 1 only in that buffer layer 33 was deposited in chamber P4 serving as an i-type film-deposition chamber. Photoelectric conversion layer 32 was deposited in chamber P2, chamber P3, and chamber P4, and then buffer layer 33 was deposited within the remaining time allowed for chamber P4 and tact time in chamber P4 was 10 minutes. Furthermore, n-type $Si_{1-x}O_x$ layer 34 and n-type microcrystalline silicon layer 35 were deposited in chamber P5, and tact time in chamber P5 was 11 minutes. Therefore, either of chambers P4 and P5 does not cause a rate-limiting factor in the manufacturing tact time, and hence manufacturing tact time in the CVD apparatus was 12 minutes, which was the same as that in Comparative Example 1.

As shown in Table 1, output properties of the photoelectric converter in Example 2 were as follows: Voc=0.883 V, Jsc=14.37 mA/cm$^2$, FF=0.711, and Eff=9.02%. The photoelectric converter of Example 2 mainly achieves increase of FF and further improvement of Eff, as compared with Example 1. It is considered that since buffer layer 33 was deposited in chamber P4 serving as an i-type film-deposition chamber, phosphorus impurities in buffer layer 33 were further decreased as compared to Example 1, whereby impurity defects were further reduced and thus carrier recombination loss in the layer was decreased causing improvement of FF.

Example 3

Photoelectric converters of Example 3 were formed with a similar structure and formation method as for the amorphous photoelectric converter of Example 1, except only that the thickness of buffer layer 33 was varied. At that time, the $H_2/SiH_4$ for depositing the buffer layer was set to be 80. FIGS. 8-11 show correlation diagrams of various output properties of the photoelectric converters of Example 3 with respect to thickness of the buffer layer, by using relative values with respect to the output properties of the photoelectric converter of Comparative Example 2.

Figure 8:
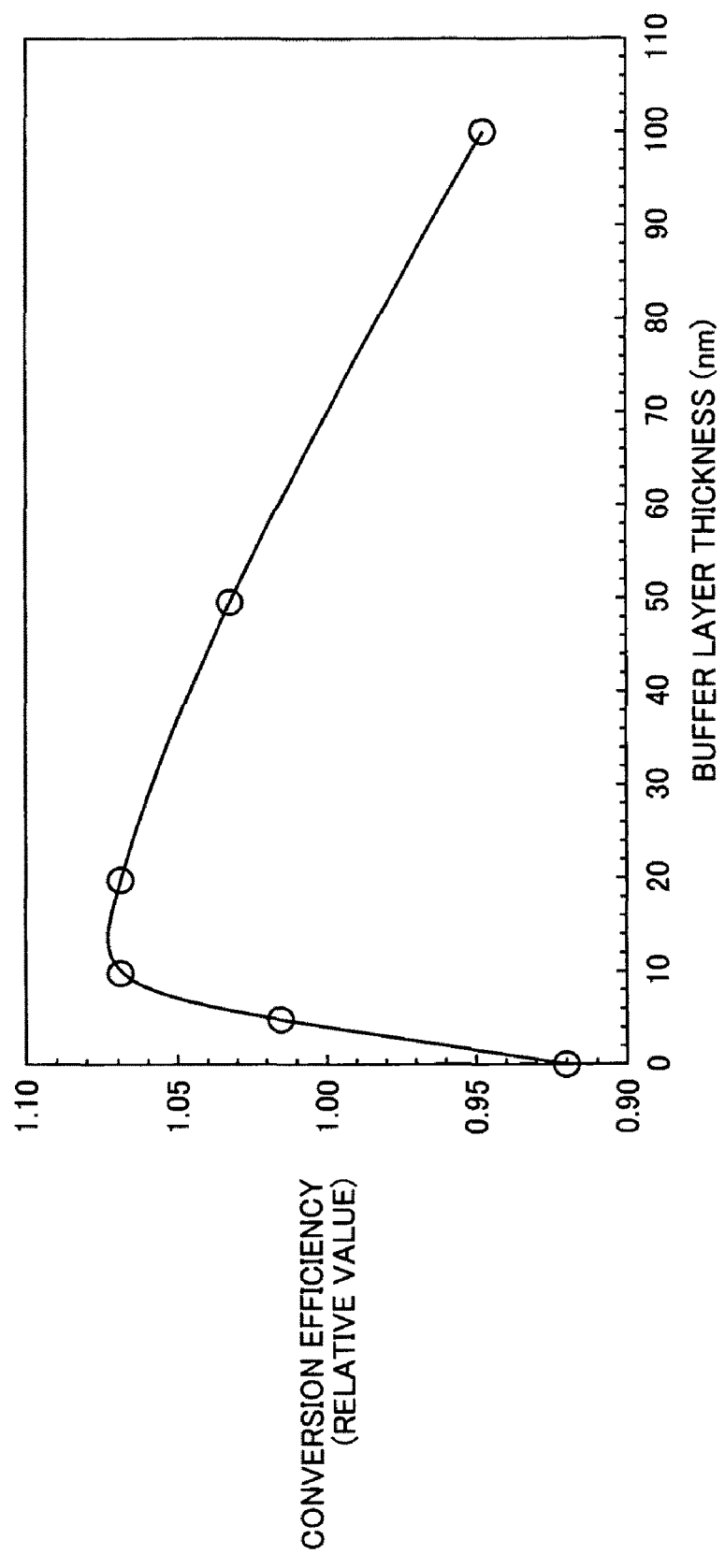
FIG. 8 is a correlation diagram of conversion efficiency (Eff) with respect to thickness of the buffer layer in the single-junction photoelectric converter.

FIG. 8 is a correlation diagram that shows a relationship between thickness of the buffer layer and conversion efficiency (Eff) of the photoelectric converter in Example 3. As thickness of the buffer layer increases, Eff drastically increases to reach the maximum value at a thickness of 10-20 nm and then gradually decreases. The Eff becomes higher in the buffer layer's thickness range of 5 nm to 50 nm, as compared to Comparative Example 2.

Figure 9:
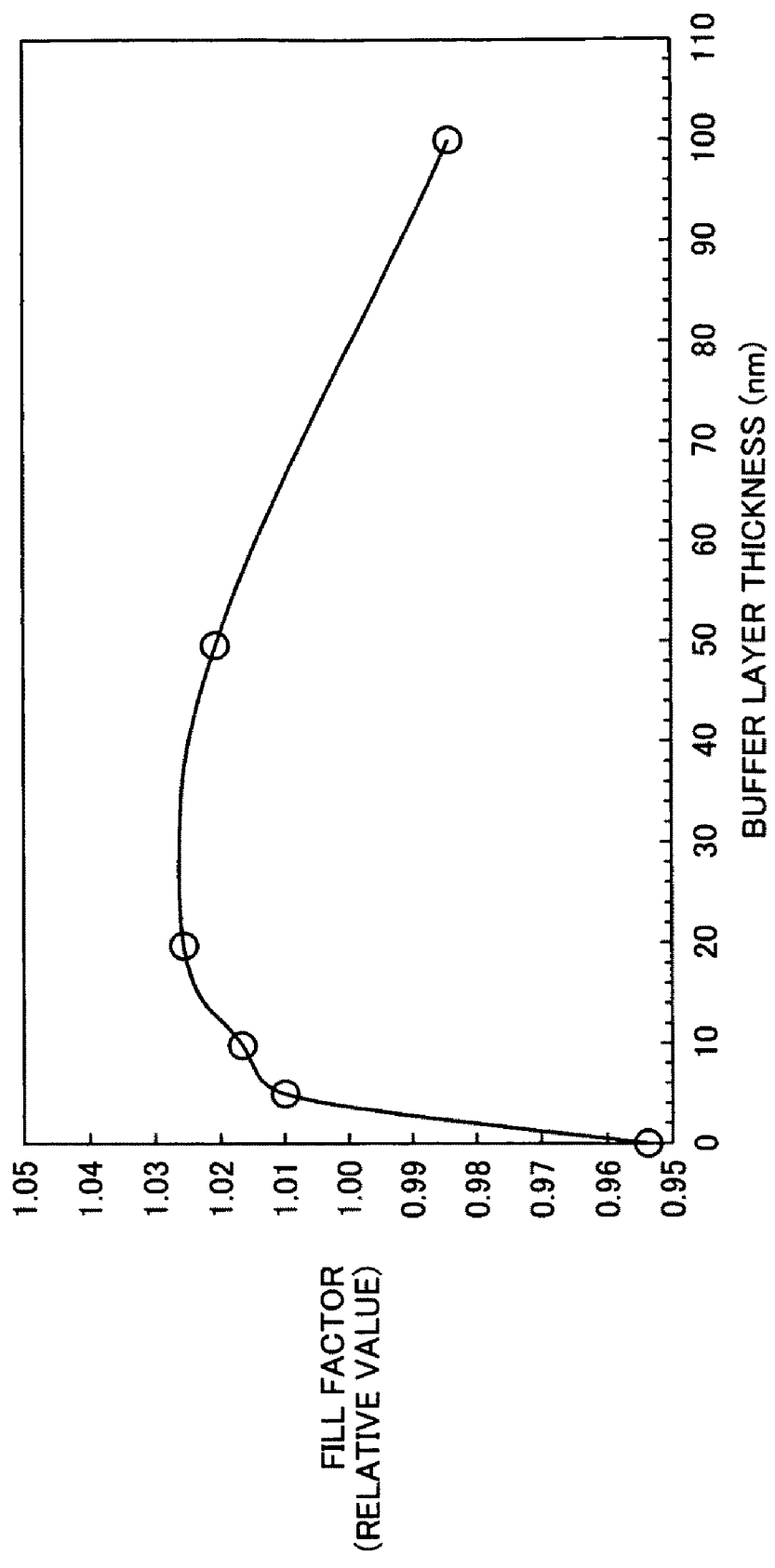
FIG. 9 is a correlation diagram of the fill factor (FF) with respect to thickness of the buffer layer in the single-junction photoelectric converter.

FIG. 9 is a correlation diagram that shows a relationship between thickness of the buffer layer and fill factor (FF) of the photoelectric converter in Example 3. As thickness of the buffer layer increases, FF drastically increases to reach the maximum value at a thickness of 20 nm and then gradually decreases.

Figure 10:
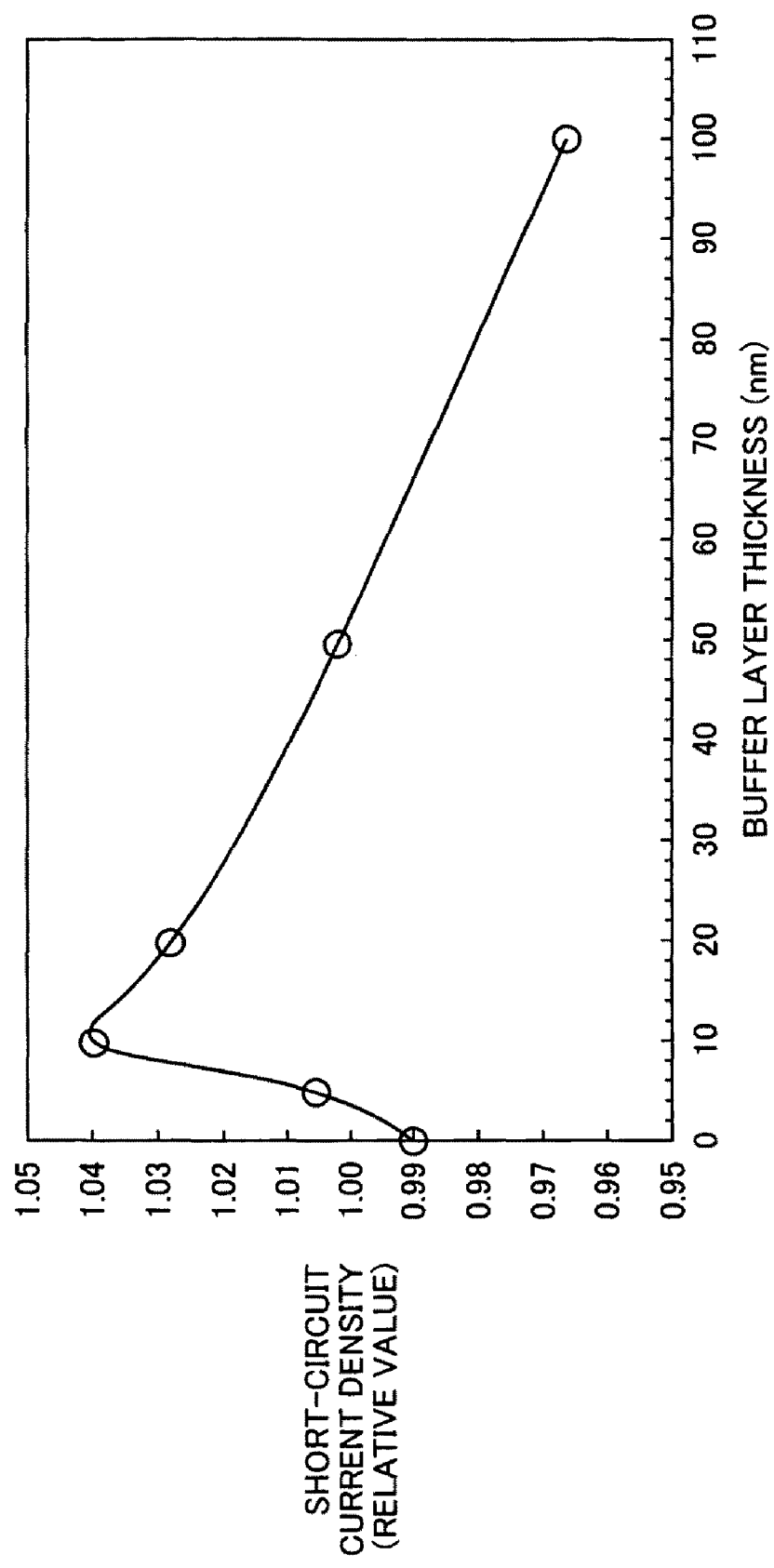
FIG. 10 is a correlation diagram of short-circuit current density (Jsc) with respect to thickness of the buffer layer in the single-junction photoelectric converter.

FIG. 10 is a correlation diagram that shows a relationship between thickness of the buffer layer and short-circuit current density (Jsc) of the photoelectric converter in Example 3. As thickness of the buffer layer increases, Jsc drastically increases to have the maximum value at a thickness of 10 nm and then decreases.

Figure 11:
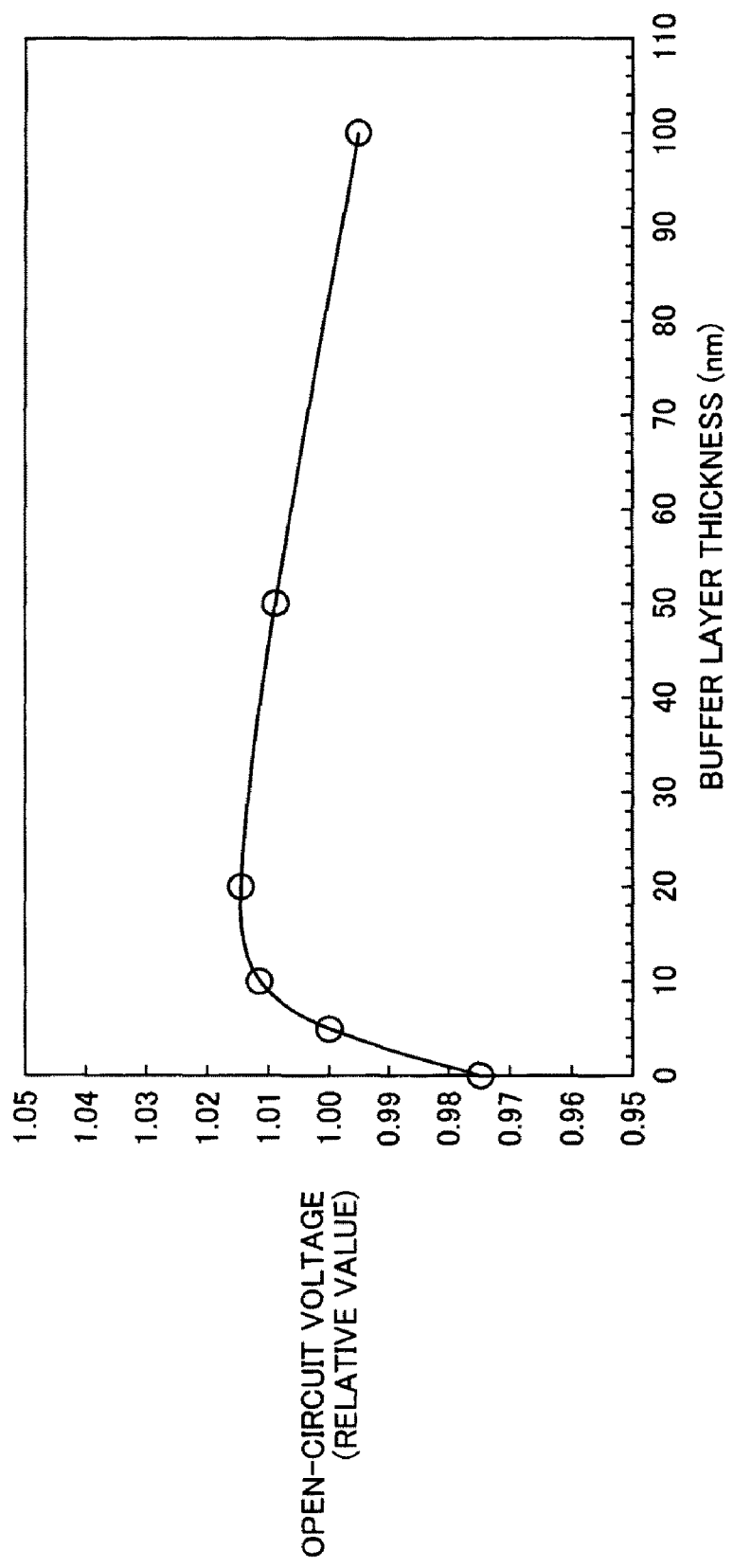
FIG. 11 is a correlation diagram of open-circuit voltage (Voc) with respect to thickness of the buffer layer in the single-junction photoelectric converter.

FIG. 11 is a correlation diagram that shows a relationship between thickness of the buffer layer and open-circuit voltage (Voc) of the photoelectric converter in Example 3. As thickness of the buffer layer increases, Voc increases and is almost saturated at a thickness of at least 20 nm.

As can be seen from FIGS. 8-11, the drastic decrease of Eff caused by making the buffer layer's thickness smaller than 5 nm is attributable to decrease in FF, Jsc and Voc. This seems to be because the buffer layer of insufficient thickness failed to produce a state just before crystallization at its interface with the photoelectric conversion layer, and then resistivity of the n-type $Si_{1-x}O_x$ layer formed thereon was reduced insufficiently. The gradual decrease of Eff in the buffer layer's thickness range more than 20 nm is mainly attributable to decrease in Jsc and FF. When the buffer layer is excessively thick, light absorption loss in the buffer layer increases thereby decreasing Jsc. Furthermore, when the buffer layer is excessively thick, resistance loss in the bulky buffer layer increases thereby decreasing FF. It is preferable to set the buffer layer's thickness to at least 5 nm and at most 50 nm, because it is possible to obtain higher Eff as compared to Comparative Example 2. It is more preferable to set the buffer layer's thickness to at least 10 nm and at most 20 nm, because it is possible to obtain higher Eff by at least 5% as compared to Comparative Example 2.

Example 4

Photoelectric converters of Example 4 were formed with a similar structure and formation method as for the amorphous photoelectric converter of Example 1, except for variation of the $H_2/SiH_4$ flow ratio for deposition of buffer layer 33. That is, the structure and formation method are similar as in Example 1, except that thickness of buffer layer 33 was set to 10 nm and the $H_2/SiH_4$ flow ratio was varied. FIGS. 12-15 show correlation diagrams between various output properties of the photoelectric converters in Example 4 and the $H_2/SiH_4$ flow ratio for deposition of the buffer layer, by using relative values with respect to the output properties of the photoelectric converter of Comparative Example 2.

Figure 12:
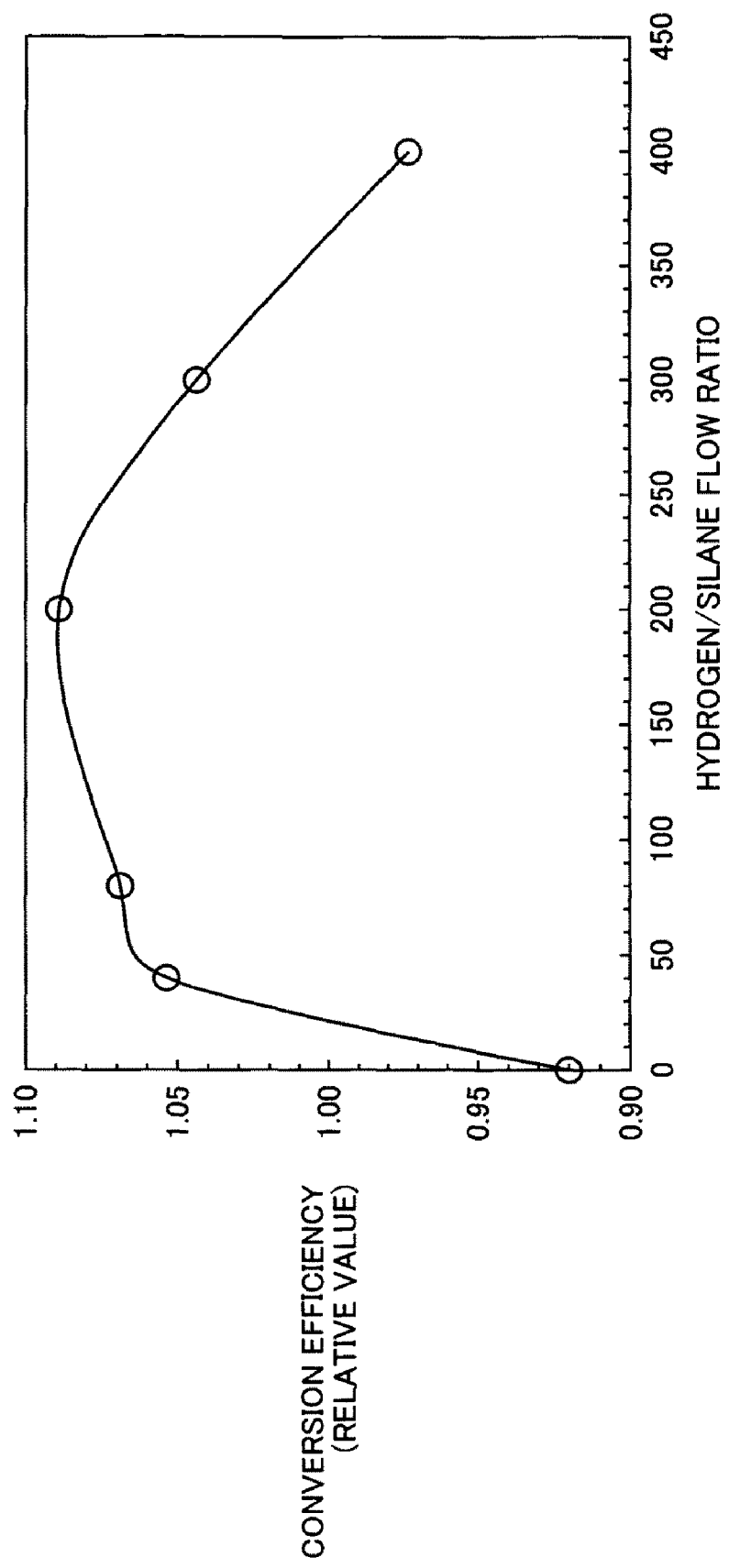
FIG. 12 is a correlation diagram of conversion efficiency (Eff) with respect to hydrogen/silane flow ratio during deposition of the buffer layer in the single-junction photoelectric converter.

FIG. 12 is a correlation diagram that shows a relationship between the $H_2/SiH_4$ flow ratio for deposition of the buffer layer and conversion efficiency (Eff) of the photoelectric converter in Example 4. As the $H_2/SiH_4$ flow ratio for the buffer layer increases, Eff drastically increases at the initial stage, moderately increases in the $H_2/SiH_4$ flow ratio range of more than 40, reaches the maximum value at the $H_2/SiH_4$ flow ratio of 200, and then gradually decreases. The Eff becomes higher in the $H_2/SiH_4$ flow ratio range of 40 to 300, as compared to Comparative Example 2.

Figure 13:
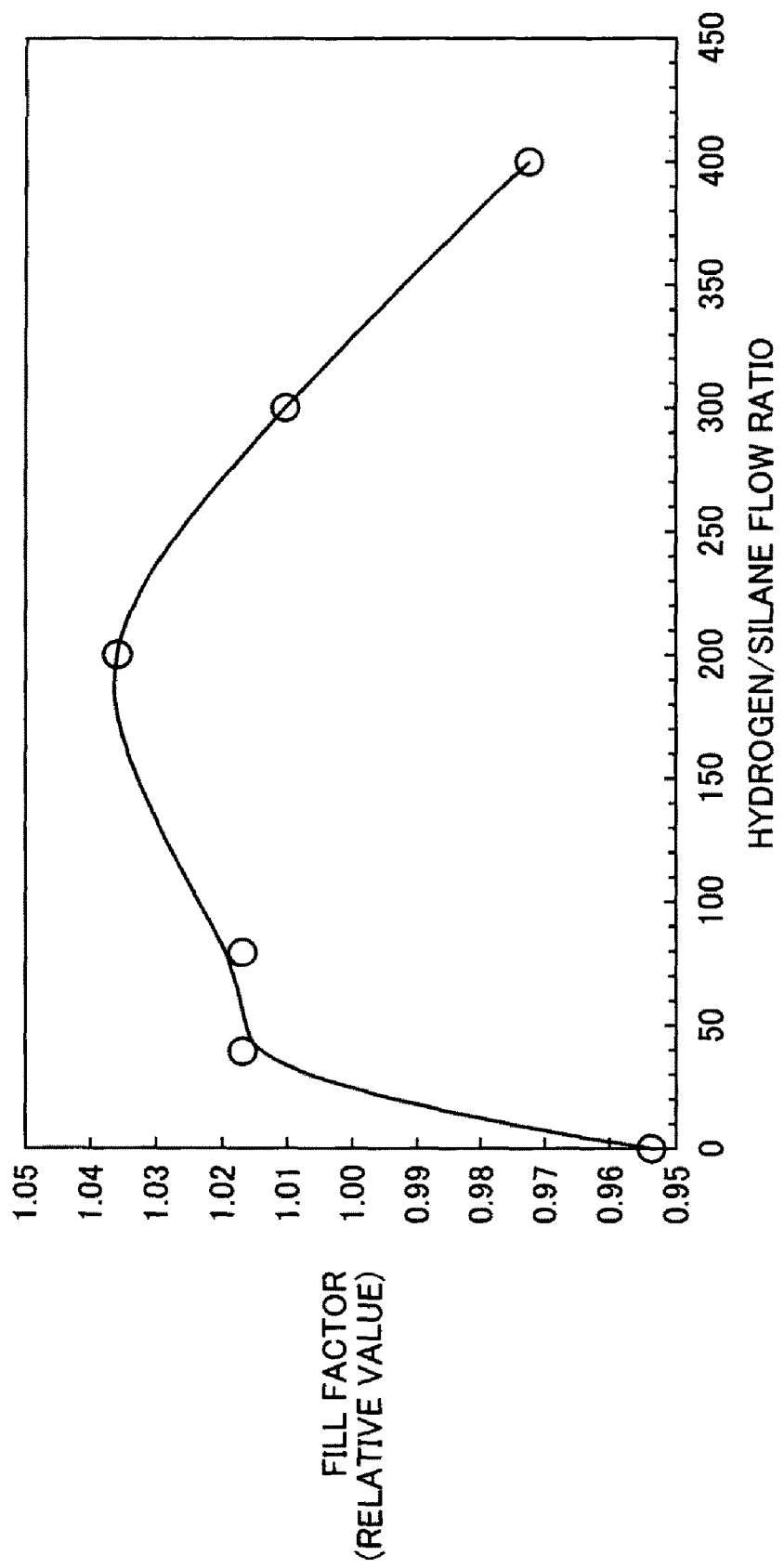
FIG. 13 is a correlation diagram of the fill factor (FF) with respect to hydrogen/silane flow ratio during deposition of the buffer layer in the single-junction photoelectric converter.

FIG. 13 is a correlation diagram that shows a relationship between $H_2/SiH_4$ flow ratio for the buffer layer and fill factor (FF) of the photoelectric converter in Example 4. The FF varies similarly as the Eff with respect to variation of the $H_2/SiH_4$ flow ratio for the buffer layer, and reaches the maximum value at an $H_2/SiH_4$ flow ratio of 200.

Figure 14:
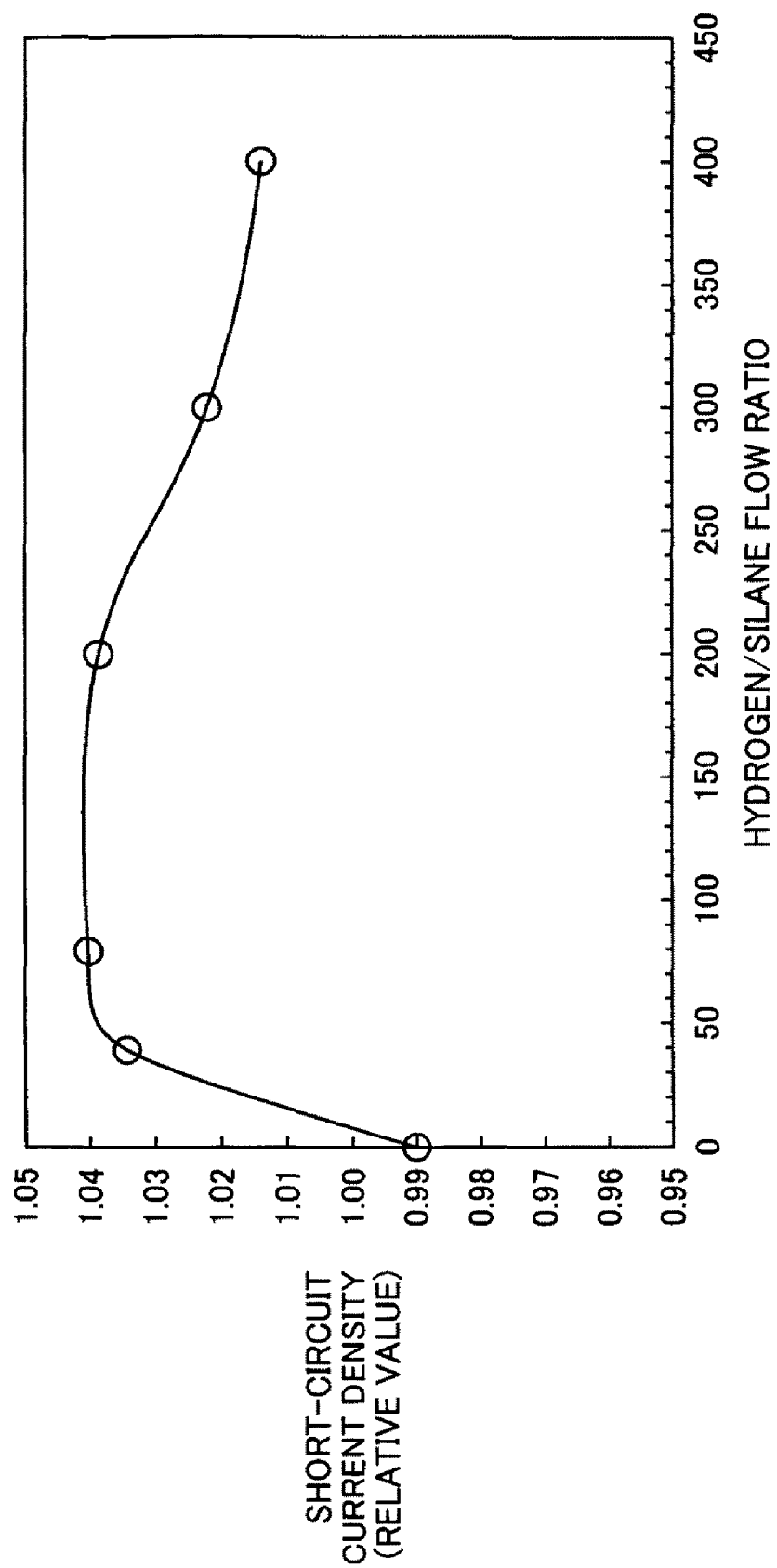
FIG. 14 is a correlation diagram of short-circuit current density (Jsc) with respect to hydrogen/silane flow ratio during deposition of the buffer layer in the single-junction photoelectric converter.

FIG. 14 is a correlation diagram that shows a relationship between the $H_2/SiH_4$ flow ratio for the buffer layer and short-circuit current density (Jsc) of the photoelectric converter in Example 4. As the $H_2/SiH_4$ flow ratio for the buffer layer increases, the Jsc drastically increases at the initial stage, becomes approximately constant in an $H_2/SiH_4$ flow ratio range of 40 to 200, and then decreases.

Figure 15:
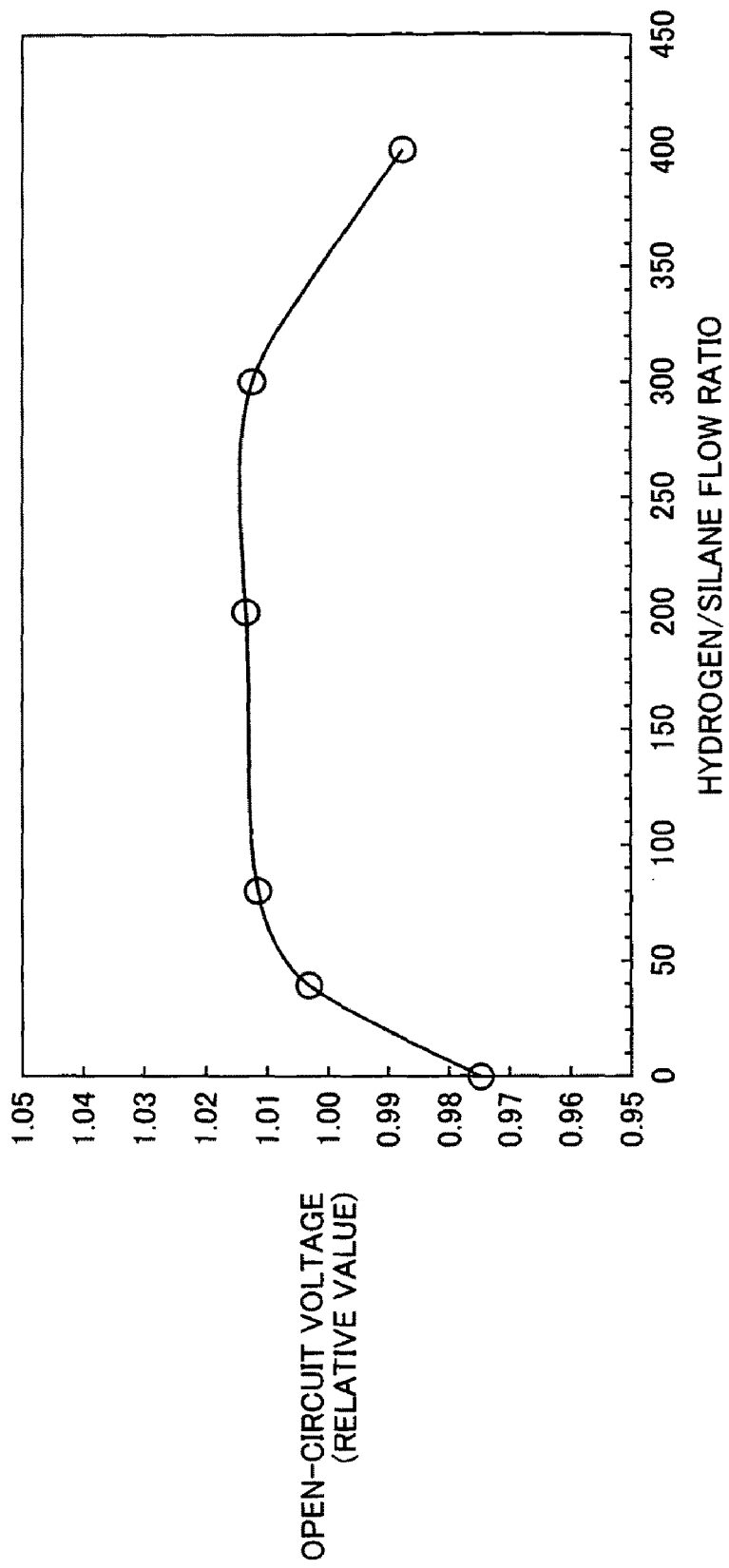
FIG. 15 is a correlation diagram of open-circuit voltage (Voc) with respect to hydrogen/silane flow ratio during deposition of the buffer layer in the single-junction photoelectric converter.

FIG. 15 is a correlation diagram that shows a relationship between the $H_2/SiH_4$ flow ratio for the buffer layer and open-circuit voltage (Voc) of the photoelectric converter in Example 4. As the $H_2/SiH_4$ flow ratio for the buffer layer increases, the Voc increases at the initial stage, becomes approximately constant in an $H_2/SiH_4$ flow ratio of 80 to 200, and then decreases.

As can be seen from FIGS. 12-15, the drastic decrease of Eff caused by making the $H_2/SiH_4$ flow ratio for the buffer layer smaller than 40 is attributable to decrease in FF, Jsc and Voc. This is because, as shown in FIG. 3, the buffer layer deposited with the low $H_2/SiH_4$ flow ratio has small quantity of hydrogen at its interface with the photoelectric conversion layer, and hence fails to produce a state just before crystallization, so that resistivity of the n-type $Si_{1-x}O_x$ layer formed thereon is insufficiently reduced. Decrease of the Eff in an $H_2/SiH_4$ flow ratio range more than 200 is mainly attributable to decrease in Jsc and FF. It is considered that when the $H_2/SiH_4$ flow ratio for deposition of the buffer layer was excessively large, the photoelectric conversion layer was etched or damaged by hydrogen atoms generated during deposition, whereby increasing defects at the interface and decreasing FF in the photoelectric conversion layer. It is also considered that the etching caused by hydrogen atoms during deposition reduced the thickness of the photoelectric conversion layer and then decreased Jsc. It is preferable to set the $H_2/SiH_4$ flow ratio for the buffer layer to at least 40 and at most 300, because it is possible to obtain higher Eff as compared to the Comparative Example 2. It is more preferable to set the $H_2/SiH_4$ flow ratio for the buffer layer to at least 80 and at most 200, because it is possible to obtain higher Eff by at least 5% as compared to Comparative Example 2.

In Examples 5, 6, and Comparative Example 3 described below, there were formed stacked-type hybrid photoelectric converters each including an amorphous photoelectric conversion unit and a crystalline photoelectric conversion unit, and experiments were conducted on them with their structures modified. At that time, there was adopted a structure including a transparent substrate/a transparent electrode layer/a p-type amorphous silicon carbide layer/a photoelectric conversion layer made of substantially i-type hydrogenated amorphous silicon/a "structure-modified portion"/a p-type microcrystalline silicon layer/a substantially i-type thin-film polycrystalline silicon layer/an n-type microcrystalline silicon layer/a back electrode layer stacked in this order, while the structure and formation method thereof were kept to be similar except for the "structure-modified portion". Table 2 collectively shows output properties of the photoelectric converters in Examples 5, 6, and Comparative Example 3. The output properties were measured at a room temperature with irradiation of AM 1.5 light at an intensity of 100 mW/cm². Abbreviations in a column of "Structure-Modified Portion" in Table 2 are the same as those in Table 1.

TABLE 2

| | "Structure-Modified Portion" | Voc (V) | Jsc (mA/cm2) | FF | Eff (%) | Note |
|---|---|---|---|---|---|---|
| Example 5 | i-buf/SiO(n) | 1.331 | 12.96 | 0.712 | 12.28 | SiO(n) has refractive index of 2.0 |
| Example 6 | i-buf/SiO(n) | 1.336 | 13.23 | 0.711 | 12.57 | SiO(n) has refractive index of 1.9 |
| Comparative Example 3 | μc-Si(n)/SiO(n) | 1.319 | 12.98 | 0.699 | 11.96 | SiO(n) has refractive index of 2.0 |

Example 5

FIG. 5 shows a cross-sectional view of a stacked-type photoelectric converter in Example 5. A transparent substrate 1 and a transparent electrode layer 2 were formed in a manner similar to that of Comparative Example 1. A front side amorphous photoelectric conversion unit 5 was formed on transparent electrode layer 2 by a plasma CVD method, which included a p-type amorphous silicon carbide layer 51 of 15 nm thickness, a photoelectric conversion layer 52 of substantially i-type hydrogenated amorphous silicon having a thickness of 350 nm, a buffer layer 53 mainly made of substantially i-type hydrogenated amorphous silicon having a thickness of 20 nm, and an n-type $Si_{1-x}O_x$ layer 54 of 50 nm thickness. Then, a rear side crystalline photoelectric conversion unit 6 was formed by a plasma CVD method, which included a p-type microcrystalline silicon layer 61 of 15 nm thickness, a photoelectric conversion layer 62 of a substantially i-type crystalline silicon having a thickness of 2.5 μm, and an n-type microcrystalline silicon layer 63 of 15 nm thickness. Subsequently, a 90 nm thick ZnO film doped with Al and a 300 nm thick Ag film were successively formed as a back electrode layer 4 by a sputtering method, thereby finishing a stacked-type photoelectric converter.

The deposition conditions for the n-type $Si_{1-x}O_x$ layer were the same as those of the Comparative Example 2. At that time, an n-type $Si_{1-x}O_x$ layer deposited to a thickness of 200 nm on a glass plate under the same deposition conditions had a refractive index of 2.0 for light of 600 nm wavelength. The deposition conditions for buffer layer 53 were as follows: an $H_2/SiH_4$ flow ratio=200, a gas flow rate of $H_2/SiH_4$=16000/80 sccm, a power supply frequency of 13.56 MHz, a power density of 200 mW/cm$^2$, a pressure of 1100 Pa, and a substrate temperature of 200° C. According to measurement by SIMS, the buffer layer had a hydrogen concentration of 2.05×10$^{22}$ atom/cc at its interface with the photoelectric conversion layer and a hydrogen concentration of 5.03×10$^{21}$ atom/cc at its interface with the n-type $Si_{1-x}O_x$ layer.

As shown in Table 2, measurement of output properties of the photoelectric converter in Example 5 showed an open-circuit voltage (Voc) of 1.331 V, a short-circuit current density (Jsc) of 12.96 mA/cm$^2$, a fill factor (FF) of 0.712, and conversion efficiency (Eff) of 12.28%.

Example 6

As Example 6, a stacked-type photoelectric converter was formed including the n-type $Si_{1-x}O_x$ layer having a refractive index of 1.9. The photoelectric converter of Example 6 had a similar structure and was formed by a similar formation method as in Example 5, except for the conditions for the n-type $Si_{1-x}O_x$ layer. The deposition conditions for the n-type $Si_{1-x}O_x$ layer were similar as in Example 5, except that the gas flow rate of $CO_2$ was changed to 220 sccm. Various properties of an n-type $Si_{1-x}O_x$ layer deposited to a thickness of 200 nm on a glass plate under the same deposition conditions were as follows. The refractive index was 1.9 for light of 600 nm wavelength, when measured by spectral ellipsometry. The electrical conductivity was 1×10$^{-5}$ S/cm. Furthermore, The intensity ratio of a TO mode peak of a crystalline silicon constituent to a TO mode peak of an amorphous silicon constituent was 1.5, when measured by Raman scattering. The oxygen concentration was 47 atomic %, when measured by X-ray photoelectron spectroscopy.

As shown in Table 2, measurement of output properties of the photoelectric converter in Example 5 showed an open-circuit voltage (Voc) of 1.336 V, a short-circuit current density (Jsc) of 13.23 mA/cm$^2$, a fill factor (FF) of 0.711, and a conversion efficiency (Eff) of 12.57%.

Comparative Example 3

As Comparative Example 3, a stacked-type photoelectric converter was formed similarly as in FIG. 5, except that buffer layer 53 was modified to be formed with n-type microcrystalline silicon and have a thickness of 20 nm.

As shown in Table 2, measurement of output properties of the photoelectric converter in Comparative Example 3 showed an open-circuit voltage (Voc) of 1.319 V, a short-circuit current density (Jsc) of 12.98 mA/cm$^2$, a fill factor (FF) of 0.699, and conversion efficiency (Eff) of 11.96%.

As compared to Comparative Example 3, Example 5 achieves increase mainly in FF and Voc and then improvement in Eff. This seems to be because the buffer layer was used instead of the n-type microcrystalline silicon layer so that defects due to phosphorus impurities were decreased and continuity of the interface from buffer layer 33 to n-type $Si_{1-x}O_x$ layer 34 was improved.

As compared to Example 5, Example 6 achieves increase in Jsc and improvement in Eff. For the reason of this, it can be said that the lowered refractive index of the n-type $Si_{1-x}O_x$ layer causes improvement in reflection property and increase in photocurrent in the front side photoelectric conversion unit and also increase in transmittance of the n-type $Si_{1-x}O_x$ layer and hence increase in photocurrent in the rear side photoelectric conversion unit as well.

N-type $Si_{1-x}O_x$ layer 53 in the stacked-type photoelectric converter is a constituent to serve as an n-type layer as well as an intermediate transmissible-reflective layer in the front side photoelectric conversion unit. In each of the single-junction photoelectric converters of Examples 1-4, importance is mainly placed on the reflection property of the n-type $Si_{1-x}O_x$ layer. In the stacked-type photoelectric converter, on the other hand, since importance is placed on the n-type $Si_{1-x}O_x$ layer's reflection property and also transmittance for longer-wavelength light, the layer is required to have a lower refractive index and a higher oxygen concentration as compared to that in the single-junction photoelectric converter. However, when the refractive index of the n-type $Si_{1-x}O_x$ layer is decreased, electrical conductivity thereof is drastically decreased and contact resistance thereof is increased, making it difficult to avoid decrease in FF. In Example 6, the buffer layer was used to make it possible that the refractive index of the n-type $Si_{1-x}O_x$ layer was actually lowered from 2.0 to 1.9 while the FF was maintained approximately the same as in Example 5.

FIG. 16 is a bright-field image of a cross section of the stacked-type photoelectric converter in Example 6 by transmission electron microscopy (TEM). In FIG. 16, an area that looks white corresponds to the n-type $Si_{1-x}O_x$ layer. Particulate silicon crystal phase parts are observed at the buffer layer's interface with the n-type $Si_{1-x}O_x$ layer.

FIG. 17 is a dark-field image of the same area as in FIG. 16 by TEM. The dark-field image is an image caused by an electron beam diffracted from a particular crystallographic plane. The diffraction does not occur in amorphous parts but occurs only in crystal parts that include a crystallographic plane forming a particular Bragg angle with respect to the incident electron beam. Accordingly, an area that is bright in the dark-field image definitely represents a crystal phase part. In FIG. 17, bright areas can definitely be observed at the buffer layer's interface with the n-type $Si_{1-x}O_x$ layer, and thus generation of silicon crystal phase parts can be confirmed. It can be said that the presence of silicon crystal phase parts at the buffer layer's interface with the n-type $Si_{1-x}O_x$ layer facilitated reduction in resistivity of the n-type $Si_{1-x}O_x$ layer, so that Example 6 could achieve a lowered refractive index of the n-type $Si_{1-x}O_x$ layer and increase in Eff. Furthermore, at that time, the buffer layer's interface with the n-type $Si_{1-x}O_x$ layer had a hydrogen concentration lower than that of the photoelectric conversion layer of hydrogenated amorphous silicon and corresponded to the portion where silicon crystal phase parts were generated.

As Examples 7 and 8 and Comparative Example 4 below, there were formed three-stacked-type photoelectric converters each provided with three photoelectric conversion units in which hydrogenated amorphous silicon, hydrogenated amorphous silicon-germanium, and crystalline silicon were used for their photoelectric conversion layers, respectively. Experiments were conducted with their structures modified. At that time, there was adopted a structure including a transparent substrate/a transparent electrode layer/a p-type amorphous silicon carbide layer/a photoelectric conversion layer of substantially i-type hydrogenated amorphous silicon/a "(first) structure-modified portion"/a p-type amorphous silicon carbide layer/a photoelectric conversion layer of substantially i-type hydrogenated amorphous silicon-germanium/a "(second) structure-modified portion"/a p-type microcrystalline silicon layer/a substantially i-type thin polycrystalline silicon layer/an n-type microcrystalline silicon layer/a back electrode layer stacked in this order, while the structure and formation method thereof were kept to be similar except for the "(first) structure-modified portion" and the "(second) structure-modified portion". Table 3 collectively shows output properties of the photoelectric converters in Examples 7 and 8, and Comparative Example 4. The output properties were measured with irradiation of AM 1.5 light at an intensity of 100 mW/cm$^2$. Abbreviations in columns of the "(first) structure-modified portion" and the "(second) structure-modified portion" in Table 3 are the same as those in Table 1.

TABLE 3

| | "(First) Structure-Modified Portion" | "(Second) Structure-Modified Portion" | Voc (V) | Jsc (mA/cm2) | FF | Eff (%) |
|---|---|---|---|---|---|---|
| Example 7 | i-buf/SiO(n) | i-buf/SiO(n) | 2.211 | 8.56 | 0.741 | 14.02 |
| Example 8 | μc-Si(n)/SiO(n) | i-buf/SiO(n) | 2.185 | 8.57 | 0.722 | 13.53 |
| Comparative Example 4 | μc-Si(n)/SiO(n) | μc-Si(n)/SiO(n) | 2.163 | 8.53 | 0.707 | 13.05 |

Example 7

Figure 18:
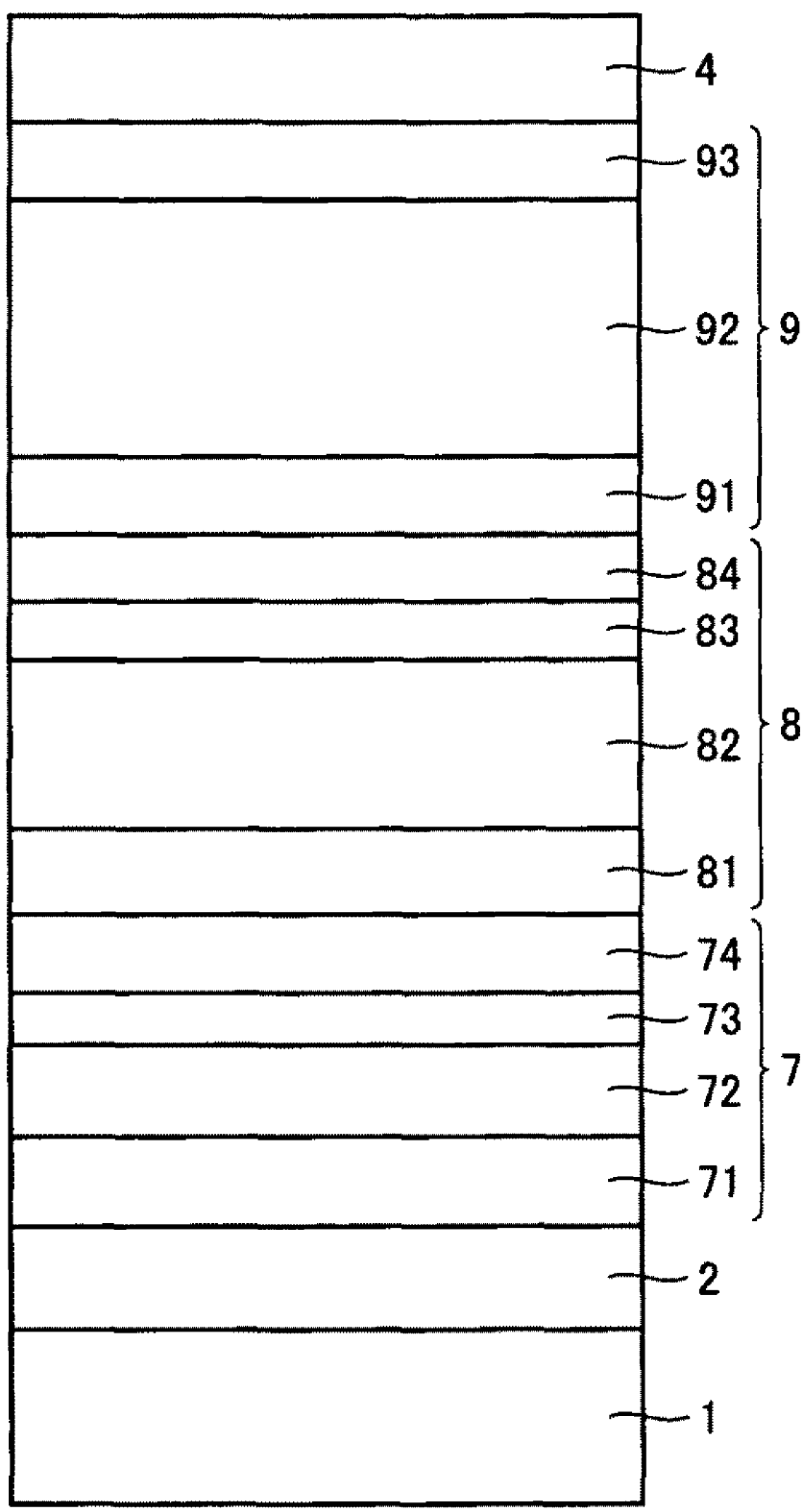
FIG. 18 is a structural cross-sectional view of a three-stacked-type photoelectric converter in Example 7 of the present invention.

FIG. 18 shows a cross-sectional view of the stacked-type photoelectric converter in Example 7. A transparent substrate 1 and a transparent electrode layer 2 were formed in a manner similar to that of Comparative Example 1. A first amorphous photoelectric conversion unit 7 was formed on transparent electrode layer 2 by plasma CVD, which included a p-type amorphous silicon carbide layer 71 of 15 nm thickness, a photoelectric conversion layer 72 of substantially i-type hydrogenated amorphous silicon having a thickness of 100 nm, a buffer layer 73 mainly made of substantially i-type hydrogenated amorphous silicon having a thickness of 20 nm, and an n-type $Si_{1-x}O_x$ layer 74 of 30 nm a thickness. A second amorphous photoelectric conversion unit was then formed by plasma CVD, which included a p-type amorphous silicon carbide layer 81 of 15 nm thickness, a photoelectric conversion layer 82 of substantially i-type hydrogenated amorphous silicon-germanium having a thickness of 350 nm, a buffer layer 83 mainly made of substantially i-type hydrogenated amorphous silicon having a thickness of 20 nm, and an n-type $Si_{1-x}O_x$ layer 84 of 50 nm thickness. Successively, a third crystalline silicon photoelectric conversion unit 9 was formed by a plasma CVD method, which included a p-type microcrystalline silicon layer 91 of 15 nm thickness, a photoelectric conversion layer 92 of a substantially i-type crystalline silicon having a thickness of 2.0 μm, and an n-type microcrystalline silicon layer 93 of 15 nm thickness. Then, a 90 nm thick ZnO film doped with Al and a 300 nm thick Ag film were successively deposited as back electrode layer 4 by a sputtering method, thereby finishing the stacked-type photoelectric converter.

N-type $Si_{1-x}O_x$ layers 74 and 84 were deposited in a manner similar to that of Example 5, while a layer deposited to a thickness of 200 nm on a glass plate under the same deposition conditions had a refractive index of 2.0 for light of 600 nm wavelength. Buffer layers 73 and 83 were also deposited with an $H_2/SiH_4$ flow ratio=200 in a manner similar to that of Example 5. According to measurement by SIMS, each of the buffer layers had a hydrogen concentration of $2.05 \times 10^{22}$ atoms/cc at its interface with the photoelectric conversion layer and a hydrogen concentration of $5.03 \times 10^{21}$ atoms/cc at its interface with the n-type $Si_{1-x}O_x$ layer. The deposition conditions for photoelectric conversion layer 82 of hydrogenated amorphous silicon-germanium were as follows: a gas flow rate of $SiH_4/GeH_4/H_2$=200/30/2000 sccm, a power supply frequency of 13.56 MHz, a power density of 20 mW/cm$^2$, a pressure of 200 Pa, and a substrate temperature of 200° C. A hydrogenated silicon-germanium layer deposited to a thickness of 300 nm on a glass plate under the same deposition conditions had a germanium concentration of 30 atomic % and an optical gap of 1.57 eV. The optical gap was determined by plotting square roots ($\sqrt{(\alpha E)}$) of products of absorption coefficients ($\alpha$) and optical energies (E) with respect to the E and determining the energy obtained at an intersection of an axis of $\alpha=0$ and an extension of a linear portion of the plotting (i.e. the optical gap was determined from so-called Tauc's plotting).

As shown in Table 3, measurement of output properties of the photoelectric converter in Example 5 showed an open-circuit voltage (Voc) of 2.211 V, a short-circuit current density (Jsc) of 8.56 mA/cm$^2$, a fill factor (FF) of 0.741, and conversion efficiency (Eff) of 14.02%.

Example 8

As Example 8, a stacked-type photoelectric converter was formed similarly as in FIG. 18, except that buffer layer 73 was replaced with an n-type microcrystalline silicon layer of 20 nm thickness.

As shown in Table 3, measurement of output properties of the photoelectric converter in Example 8 showed an open-circuit voltage (Voc) of 2.185 V, a short-circuit current density (Jsc) of 8.57 mA/cm$^2$, a fill factor (FF) of 0.722, and conversion efficiency (Eff) of 13.53%.

Comparative Example 4

As Comparative Example 4, a stacked-type photoelectric converter was formed similarly as in FIG. 18, except that each of buffer layer 73 and buffer layer 83 was replaced with an n-type microcrystalline silicon layer of 20 nm thickness.

As shown in Table 3, measurement of output properties of the photoelectric converter in Comparative Example 4 showed an open-circuit voltage (Voc) of 2.163 V, a short-circuit current density (Jsc) of 8.53 mA/cm$^2$, a fill factor (FF) of 0.707, and conversion efficiency (Eff) of 13.05%.

As compared to Comparative Example 4, Example 8 achieves increase in FF and Voc, and improvement in Eff. This seems to be because the buffer layer was used instead of the n-type microcrystalline silicon layer in the second photoelectric conversion unit, so that defects due to phosphorus impurities were reduced and continuity at the interface from buffer layer 83 to n-type $Si_{1-x}O_x$ layer 84 was improved. Furthermore, it can be said that the buffer layer is effective even though photoelectric conversion layer 82 is a silicon alloy layer made of hydrogenated amorphous silicon-germanium.

As compared to Example 8, Example 7 achieves further increase in FF and Voc, and improvement in Eff. By including buffer layers in two positions, i.e., the first photoelectric conversion unit and the second photoelectric conversion unit, effects of the buffer layers were distinctively exhibited, resulting in improved properties of the photoelectric converter. Accordingly, it can be said that inclusion of the buffer layers in the three-stacked-type photoelectric converter is more effective as compared inclusion of the buffer layer in the two-stacked-type photoelectric converter.

The invention claimed is:

1. A silicon-based thin-film photoelectric converter comprising: a transparent substrate; a substantially i-type photoelectric conversion layer of hydrogenated amorphous silicon or a hydrogenated amorphous silicon alloy; a substantially i-type buffer layer mainly made of hydrogenated amorphous silicon; and an n-type $Si_{1-x}O_x$ layer (x is 0.25-0.6) stacked successively, wherein the buffer layer
has a higher hydrogen concentration at its interface with and as compared with said photoelectric conversion layer,
has a lower hydrogen concentration at its interface with said n-type $Si_{1-x}O_x$ layer, as compared to said photoelectric conversion layer, and
has a thickness of at least 5 nm and at most 50 nm,
wherein the transparent substrate is on a light incident side of the photoelectric conversion layer,
wherein the substantially i-type photoelectric conversion layer, the substantially i-type buffer layer, and the n-type $Si_{1-x}O_x$ layer are stacked successively from the light incident side (transparent substrate side),
wherein said buffer layer has a hydrogen concentration of at least $1\times10^{22}$ atoms/cc measured by SIMS at its interface with said photoelectric conversion layer.

2. The silicon-based thin-film photoelectric converter according to claim 1, wherein said buffer layer includes crystal phase parts at its interface with said n-type $Si_{1-x}O_x$ layer.

3. The silicon-based thin-film photoelectric converter according to claim 1, wherein said n-type $Si_{1-x}O_x$ layer includes silicon-rich phase parts in its amorphous silicon-oxygen alloy phase.

4. The silicon-based thin-film photoelectric converter according to claim 3, wherein said silicon-rich phase parts include silicon crystal phase parts.

5. A method of manufacturing the silicon-based thin-film photoelectric converter recited in claim 1, wherein said buffer layer is formed by using a mixed gas containing at least hydrogen and silane as a source gas with hydrogen/silane flow ratio within a range of 40-300.

6. The method of manufacturing the silicon-based thin-film photoelectric converter according to claim 5, wherein at least a part of said photoelectric conversion layer and said buffer layer are deposited in the same film-deposition chamber.

7. The silicon-based thin-film photoelectric converter according to claim 1, wherein said buffer layer has a thickness of not less than 10 nm and at most 50 nm.

* * * * *